US009341831B2

(12) United States Patent
Nakano et al.

(10) Patent No.: US 9,341,831 B2
(45) Date of Patent: May 17, 2016

(54) OPTICAL SYSTEM WITH CATADIOPTRIC OPTICAL SUBSYSTEM

(75) Inventors: Masatsugu Nakano, Tochigi (JP); Jose Manuel Sasian-Alvarado, Tucson, AZ (US)

(73) Assignees: Canon Kabushiki Kaisha, Tokyo (JP); The Arizona Board of Regents on Behalf of the University of Arizona, Tucson, AZ (US)

( * ) Notice: Subject to any disclaimer, the term of this patent is extended or adjusted under 35 U.S.C. 154(b) by 159 days.

(21) Appl. No.: 14/124,646

(22) PCT Filed: Jun. 8, 2012

(86) PCT No.: PCT/US2012/041698
§ 371 (c)(1),
(2), (4) Date: Apr. 1, 2014

(87) PCT Pub. No.: WO2012/170916
PCT Pub. Date: Dec. 13, 2012

(65) Prior Publication Data
US 2014/0204473 A1 Jul. 24, 2014

Related U.S. Application Data

(60) Provisional application No. 61/520,518, filed on Jun. 10, 2011.

(51) Int. Cl.
G02B 17/08 (2006.01)
G03F 7/20 (2006.01)

(52) U.S. Cl.
CPC ........ G02B 17/0856 (2013.01); G02B 17/0808 (2013.01); G03F 7/70225 (2013.01); G03F 7/70241 (2013.01); G03F 7/70275 (2013.01)

(58) Field of Classification Search
CPC ............ G02B 17/0856; G02B 17/0808; G03F 7/70225; G03F 7/70241; G03F 7/70275
USPC ........................................................ 359/726
See application file for complete search history.

(56) References Cited

U.S. PATENT DOCUMENTS

| 4,907,864 A | 3/1990 | Hagerty et al. |
| 5,650,877 A | 7/1997 | Phillips, Jr. et al. |

(Continued)

FOREIGN PATENT DOCUMENTS

| JP | H06-148573 A | 5/1994 |
| JP | H06-148574 A | 5/1994 |

(Continued)

OTHER PUBLICATIONS

Blaisse, et al., "Catadioptric microscope objective with concentric mirrors", Applied Scientific Research, Section B, (1952) pp. 453-466, vol. 2, No. 1.

*Primary Examiner* — David N Spector
(74) *Attorney, Agent, or Firm* — Canon USA Inc., IP Division

(57) ABSTRACT

An optical system to form an image on an image plane includes, a catadioptric optical subsystem configured to collect light from an object plane; and a refractive optical subsystem configured to form the image on the image plane, the catadioptric and refractive optical subsystems being arranged in order from the object plane to the image plane along an optical axis of the optical system. A baffle to shut off light traveling toward the image plane without being reflected by the catadioptric optical subsystem is placed in the optical system, in order to form a shielded portion in a center of an exit pupil plane of the optical system, and the catadioptric optical subsystem includes a partially transparent surface around the optical axis of the optical system so that transmissivity of a region, other than the shielded portion, at the exit pupil plane varies in a radial direction of the exit pupil plane.

19 Claims, 21 Drawing Sheets

(56) References Cited

U.S. PATENT DOCUMENTS

| | | |
|---|---|---|
| 5,841,574 A | 11/1998 | Willey |
| 6,449,103 B1 | 9/2002 | Charles |
| 2006/0091324 A1 | 5/2006 | Dierichs |
| 2009/0086338 A1 | 4/2009 | Epple |
| 2014/0226203 A1* | 8/2014 | Nakano et al. ............ 359/365 |

FOREIGN PATENT DOCUMENTS

| | | |
|---|---|---|
| JP | 2002-082285 A | 3/2002 |
| JP | 2003-527636 A | 9/2003 |
| JP | 2007-514179 A | 5/2007 |
| JP | 2007-523383 A | 8/2007 |
| JP | 2007-531060 A | 11/2007 |

* cited by examiner

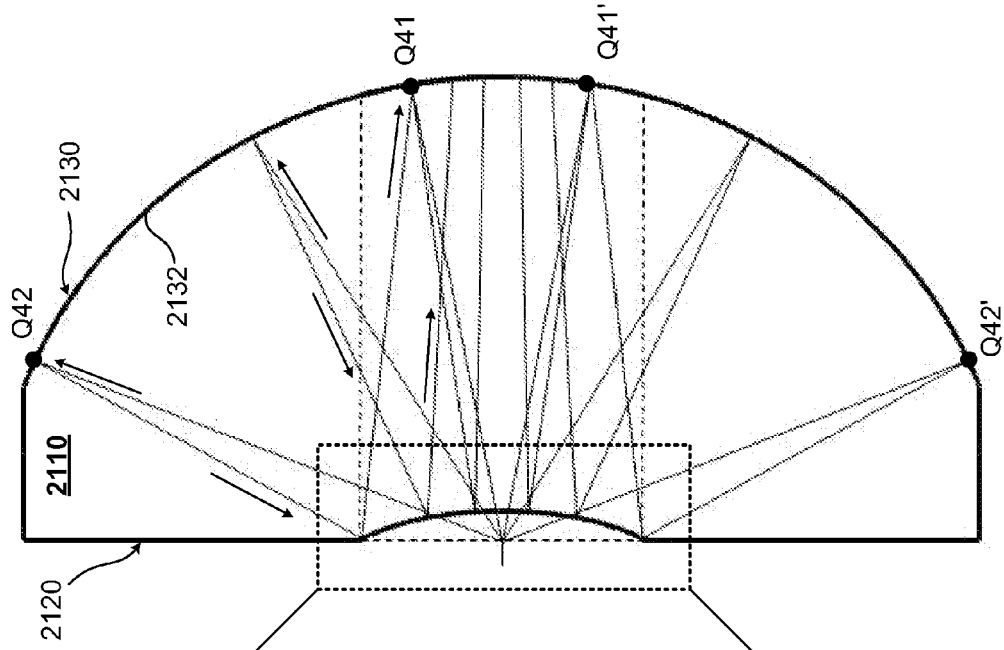
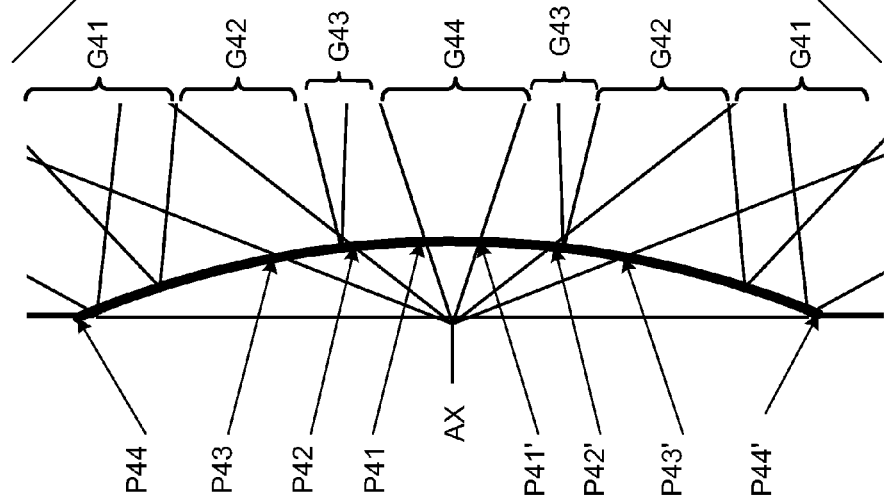

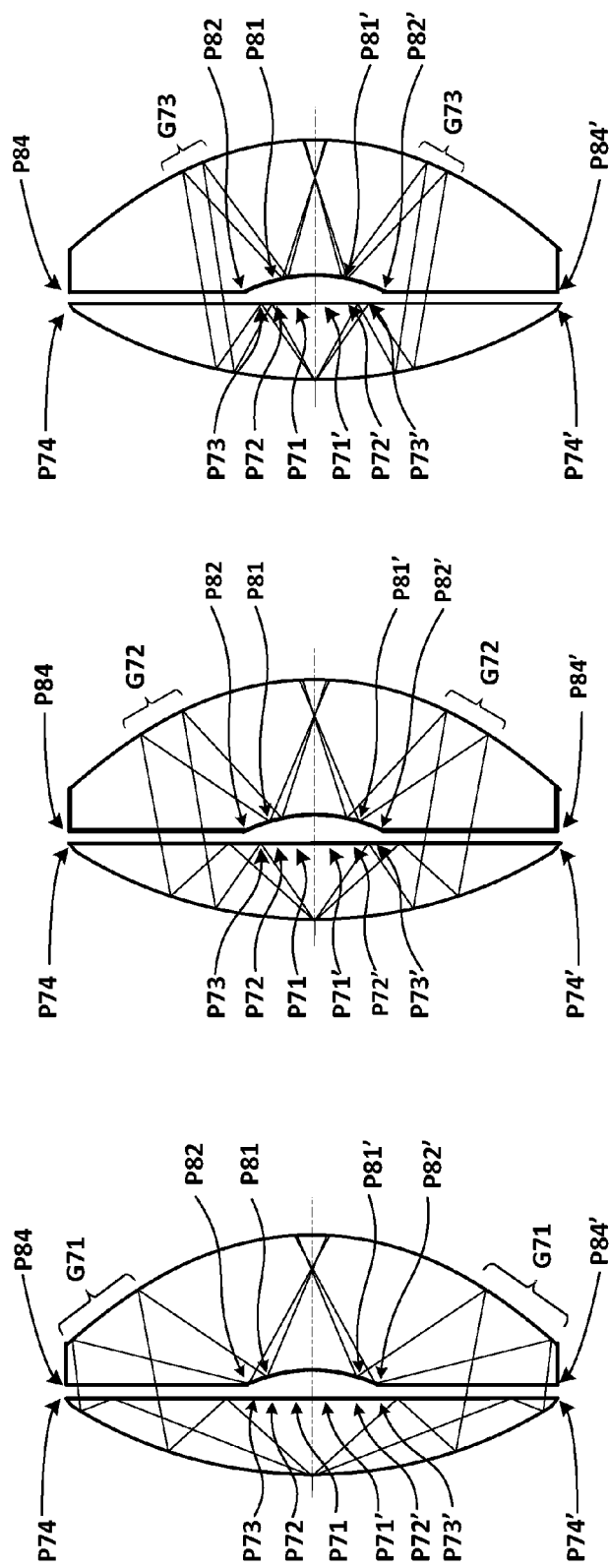

OPTICAL SYSTEM WITH CATADIOPTRIC OPTICAL SUBSYSTEM

CROSS REFERENCE TO RELATED APPLICATIONS

This application claims priority to U.S. provisional application No. 61/520,518 filed Jun. 10, 2011 entitled "EXTREME HIGH NUMERICAL APERTURE RELAY SYSTEMS," the entire contents of which are hereby incorporated by reference.

BACKGROUND OF THE INVENTION

1. Field of the Invention

The present invention relates in general to optical imaging, and more in particular to an optical system with a catadioptric optical subsystem which may be used as a microscope's objective system or a lithographic projection system, for example.

2. Description of Related Art

A catadioptric system, which includes a combination of catoptric (reflective) and dioptric (refractive) optical components, can be used as a microscope objective system or lithographic projection system. When an axisymmetric mirror is used in such a system, there is a light-blocking portion (i.e., an obscured portion) on the optical axis of the system. An obscuration ratio—which characterizes the fraction of blocked light—is defined by Equation (1), as follows.

$$\text{Obscuration} = \frac{\sin\theta_l}{\sin\theta_m} \times 100 \quad (1)$$

where $\theta_l$ is the lowest angle to achieve a required obscuration ratio (hereafter $\theta_l$ will be referred to as the "lowest obscuration angle"), and $\theta_m$ is the angle formed between the marginal ray that comes from the object and the normal to the surface where the marginal ray impinges (hereinafter $\theta_m$ is referred to as the "marginal angle").

As it is known to persons having ordinary skill in the art, a quantitative measure of image quality is the modulation transfer function (MTF). MTF describes the ability of a lens or optical system to transfer contrast from the object to the image produced by the lens or system. In an optical microscope, the MTF is a measurement of the microscope's ability to transfer contrast from the object to the image plane at a specific resolution. Naturally, any obstruction placed in the light path of a microscope's imaging system not only will reduce image contrast, but will also produce a loss of energy in the intensity distribution of light detected at the image plane.

The MTF of a microscope can be obtained from the contrast generated by periodic lines spaced at a predetermined distance present in an object that result in sinusoidal intensities in the image. These sinusoidal intensities vary as a function of spatial frequency. For example, if an object having absorbing and transparent line pairs with a spatial period of 1 micron (spatial frequency 1000 lines per millimeter) is imaged with a high NA microscope, the individual lines would be imaged (resolved) with a moderate degree of image contrast. Decreasing the distance between the line pairs to a spatial period of 0.5 microns (spatial frequency equal to 2000 lines per millimeter) would reduce contrast in the final image and may not be resolvable, but increasing the spatial period to 2 microns (spatial frequency equal to 500 lines per millimeter) would increase image contrast and would be easily resolvable.

FIG. 1A illustrates a graph showing the manner in which obscuration ratio of an optical system affects the MTF. As it can be appreciated from FIG. 1A, the MTF, especially at low and middle spatial frequencies, can be degraded as the obscuration ratio becomes larger.

To increase MTF, there is a need to decrease the obscuration in the optical system while continuing to use the catadioptric subsystem.

Previous attempts to addressing the problem of obscuration have been made. For example, U.S. Pat. No. 5,650,877 to Phillips Jr. et al., discloses a lithographic projection system in which a catadioptric optical element having specially configured front and back surfaces projects a reduced image of a reticle onto a substrate with high NA radiation. The back (last) surface of the optical element (closest to the substrate) has a central aperture surrounded by a concave reflective portion. The front surface (opposite to the back surface), through which radiation illumination passes, has a partially reflective coating that transmits therethrough part of an incident light beam toward the concave reflecting portion of the back surface. The partially reflective coating provides partial transmission uniformly through the surface.

When the concave reflective portion returns the received light to the front surface, the partially reflective coating partially reflects and partially transmits the light returned by the concave reflective portion on a converging path through the central aperture to the substrate. According to U.S. Pat. No. 5,650,877, central obscuration may controlled by covering part of the front surface to block a part of the illumination beam corresponding to direct light that would not be reflected by the concave reflective portion. However, although relatively low obscuration may be obtained by blocking the direct light, substantial energy loss is caused by uniform partial transmission and reflection of the front surface. Japanese patent application publication JP2002-82285 also discloses similar method related to the use of a semitransparent coating.

B. S. Blaisse et al., in "Catadioptric microscope objective with concentric mirrors", APPLIED SCIENTIFIC RESEARCH, SECTION B, Volume 2, Number 1 (1952), pages 453-466, disclose another way of using a semitransparent coating. Specifically, Blaisse discloses the use of a partial reflection coating, as follows. A semitransparent coating whose reflectance is 50% is coated only on section between points P1P2 on a convex surface, not the whole surface. 100% reflectance coating is put in section P2P2' on the same convex surface. Light coming from object O is divided into 3 light ray groups G1 to G3 as shown in FIG. 1B. Light ray G1 is between P0 and P1 on surface 4, G2 is between P1 and P2 on surface 4, and G3 is between P2 and P3 on surface 4. Route of G1 passes through region P0-P1 of surface 4 and is reflected by region Q1-Q2 of surface 2 without any loss. After that, region P1-P2 reflects G1 with 50% loss. Light rays G2 pass through region P1-P2 with 50% loss and are reflected by section Q2-Q3. After that, G2 is reflected by P2-P3 without any loss. Light rays G3 cannot pass through region P2-P3. In other words, region P2-P3 acts as a baffle by blocking part of the light from the object O.

From the foregoing state of the art, it is seen therefore, that a partially reflective or graded coating can be used to control the level of obscuration ratio in a catadioptric optical system. However, the obscuration ratio will inevitably degrade the modulation transfer function of the optical system. Accordingly, there is a need to decrease the obscuration ratio while optimizing the modulation transfer function.

SUMMARY OF THE INVENTION

Embodiments of the present invention provide an apparatus and a method for.

According to an aspect of the present invention, it is provided an optical system to form an image on an image plane includes a catadioptric optical subsystem configured to collect light from an object plane; and a refractive optical subsystem configured to form the image on the image plane, the catadioptric and refractive optical subsystems being arranged in order from the object plane to the image plane along an optical axis of the optical system, wherein a baffle to shut off light traveling toward the image plane without being reflected by the catadioptric optical subsystem is placed in the optical system, in order to form a shielded portion in a center of an exit pupil plane of the optical system, and the catadioptric optical subsystem includes a partially transparent surface around the optical axis of the optical system so that transmissivity of a region, other than the shielded portion, at the exit pupil plane varies in a radial direction of the exit pupil plane.

Further features of the present invention will become apparent from the following description of exemplary embodiments with reference to the attached drawings.

BRIEF DESCRIPTION OF THE DRAWINGS

FIGS. 7A and 7B respectively illustrate a catadioptric subsystem and a MTF thereof. The catadioptric subsystem has an object-side surface with a semitransparent coating disposed rotationally symmetric along the optical axis so as to provide a transmissivity distribution in a radial direction.

FIGS. 19A through 19F illustrate exemplary ray-tracing of light rays coming from an object plane and transmitting through the catadioptric subsystem CG illustrated in FIG. 13.

DESCRIPTION OF THE EMBODIMENTS

Embodiments according to the present invention will be described below with reference to the attached drawings. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the side of an optical component (lens, mirror or system thereof) where the object to be imaged is placed is interchangeably referred to as the "object-plane side", "object side", or "front side" of the optical component; and the side of optical component where the image is formed is interchangeably referred to as the "image-plane side", "image side" or "back side" of the optical component. Accordingly, in the various drawings discussed below, the left side of each figure illustrating a lens, mirror or optical system thereof will be referred to as the front or object side, whereas the opposite side thereof (right side) will be referred to as the back or image side.

Figure 1A:
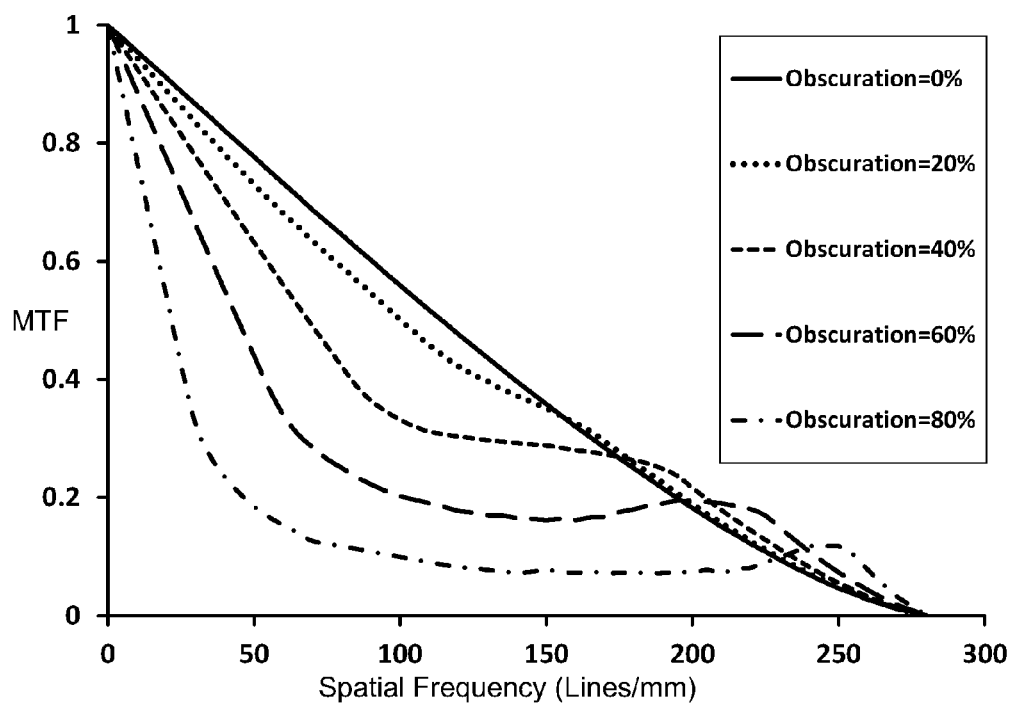
FIG. 1A illustrates a graph of the modulation transfer function (MTF) in terms of obscuration ratio.
Figure 1B:
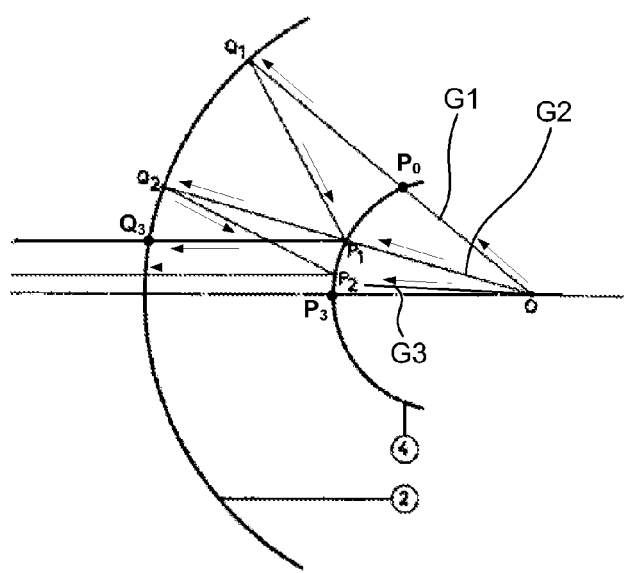
FIG. 1B illustrates a conventional use of a partial reflection coating for a catadioptric subsystem.
Figure 2:
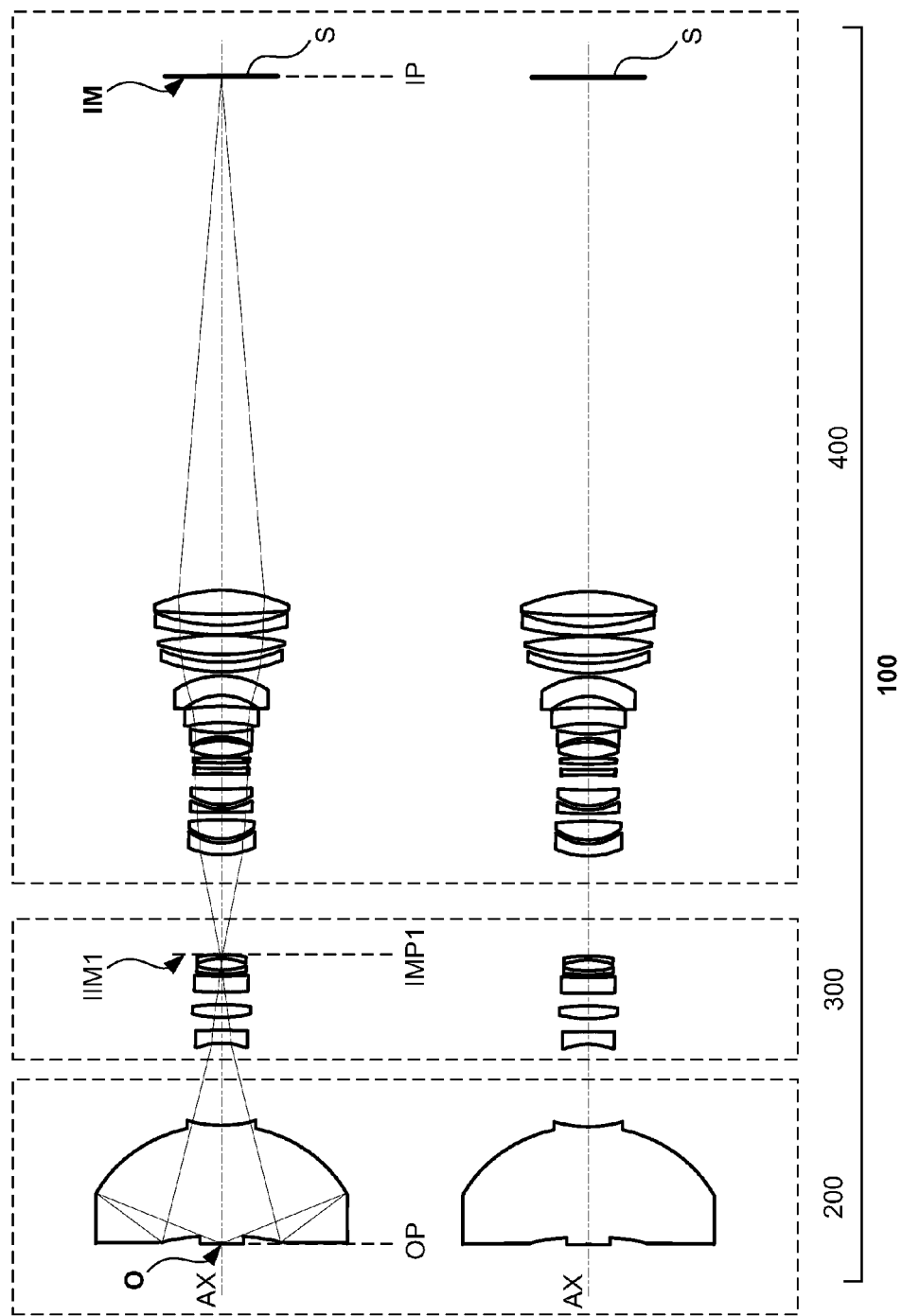
FIG. 2 illustrates an optical system with a catadioptric subsystem, a field lens system and a re-imaging lens subsystem, in accordance with an embodiment of the present invention.

FIG. 2 illustrates a general overview of an optical system 100 with a catadioptric subsystem 200, a field lens group 300, and a re-imaging lens subsystem 400, in accordance with an embodiment of the present invention. In FIG. 2, the upper part illustrates a cross-section of the optical system 100 with exemplary ray-tracing, and the lower part illustrates the general outline of optical components in the catadioptric subsystem 200, the field lens group 300, and the re-imaging lens subsystem 400 without ray-tracing.

In operation, the optical system 100 is configured to form, at an image plane IP, an image IM of an object O located at an object plane OP. The image plane IP may correspond to an image surface of a solid-state image sensor S, such as a CCD sensor or a CMOS sensor, for example. The optical system 10 can also operate in reverse where the object plane OP and the image plane IP are interchanged, as in the case of a lithographic projection system. Notably, when applied to a microscope, the catadioptric subsystem 200 is configured to collect light coming from the object O, and pass the collected light towards an image plane IP via the field lens group 300 and the re-imaging lens subsystem 400. That is, the optical system 100 acts as a relay system between the object plane OP and the image plane IP. As illustrated in FIG. 2, the catadioptric subsystem 200 passes the collected light to the field lens group 300, which in turn forms an intermediate image IIM1 at an intermediate image plane IMP1. Then, the intermediate image IIM1 serves as the object for the re-imaging lens subsystem 400, which forms the final image IM on the image plane IP.

Naturally, the optical system 100 is not necessarily limited to the components illustrated in FIG. 2. For example, the optical system 100 is not limited to including the re-imaging lens subsystem 400, nor is it limited to forming the intermediate image IIM1 at the IMP1 prior to forming the final image IM. Persons having ordinary skill in the art will appreciate that the optical system 100 may operate without departing from the spirit and scope of the present invention even if either the field lens 300 or the re-imaging lens subsystem 400 were to be removed. In addition, the optical system 100 may be configured to provide a final image IM regardless of whether it forms one or more intermediate images, or even if it forms not intermediate images at all.

<Catadioptric Subsystem>

Figure 3:
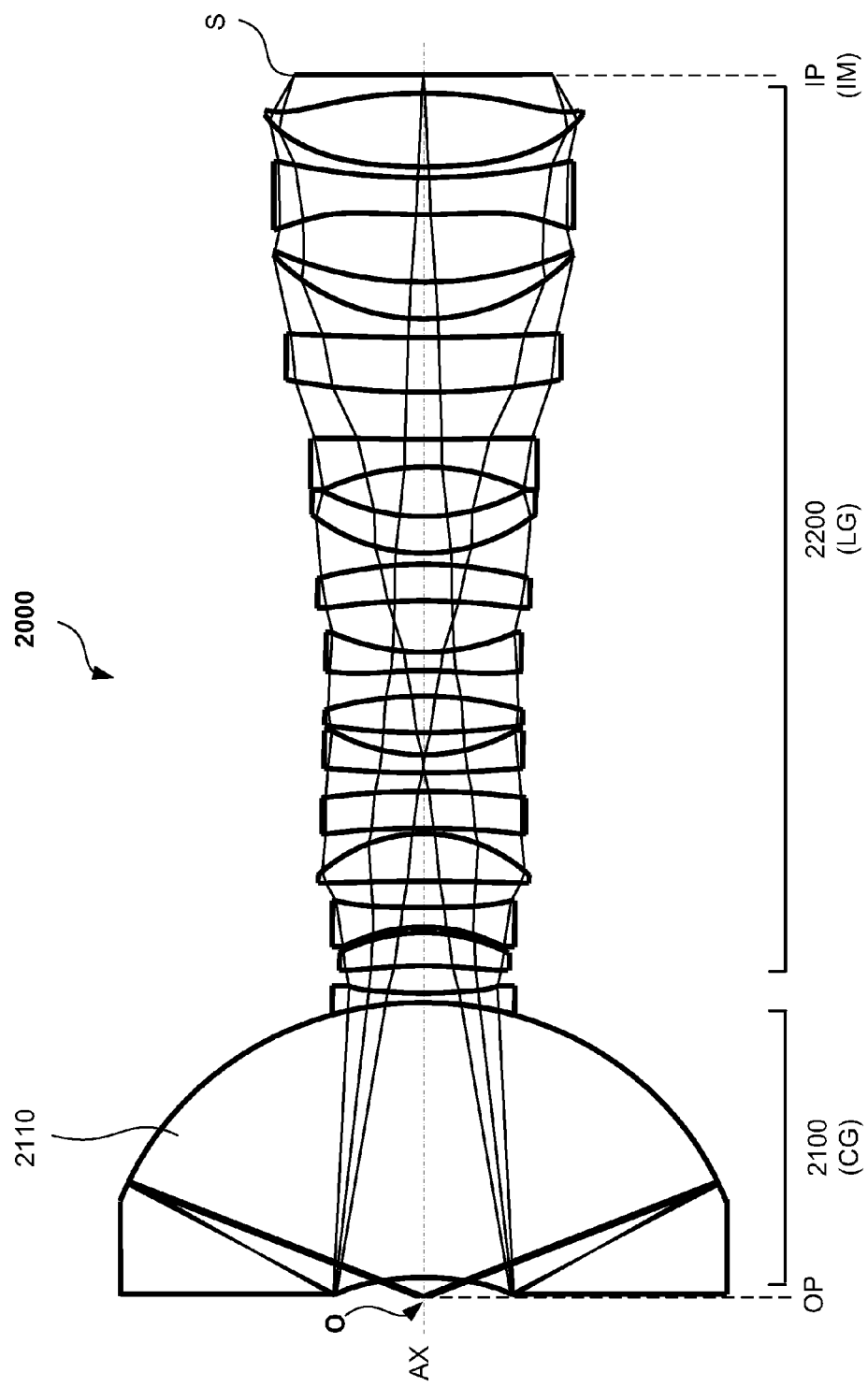
FIG. 3 illustrates an optical system with catadioptric subsystem and a field lens system, in accordance with a further embodiment of the present invention.

Turning now to FIG. 3, an optical system 2000 including a catadioptric subsystem 2100 and a lens subsystem 2200 will be described in detail. FIG. 3 illustrates the optical system 2000 with the catadioptric subsystem 2100 disposed along an optical axis AX, and the lens subsystem 2200 arranged in axial alignment with the catadioptric subsystem 2100. In the present embodiment, a catadioptric component CG is used as the catadioptric subsystem 2100, and a lens group LG is used for the lens subsystem 2200. Examplary lens data for the optical system 2000 is described in the "Numerical Examples" section and summarized in Tables 1a and 1b. In order to form an object-space telecentric system (i.e., a system that has the exit pupil at infinity) an aperture stop STO is considered to be located at the front focal plane of the optical system. Herein, when the entrance or exit pupil are located at a distance of at least 100000 mm away from the object plane OP it is said that the entrance or exit pupil are effectively at infinity. In an actual embodiment, however, an exit pupil plane of the outermost field of view is designed to be located at a distance of 169 mm apart from object plane OP to the right thereof.

Figure 4A:
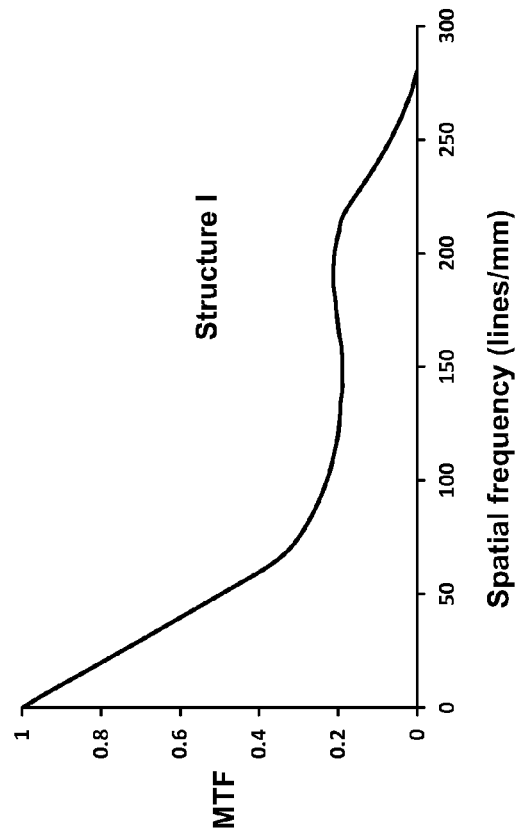
FIGS. 4A and 4B respectively illustrate an example of a catadioptric subsystem and a MTF thereof.

The catadioptric component CG is preferably formed by a solid optical component 2110 (not necessarily of a single piece) with a reflective film on both sides thereof except for a central portion along the optical axis AX. A device used to restrain the flow of direct light along the optical axis, a baffle 2300, is placed along the optical axis AX. In operation, the optical system 2000 is configured to collect light coming an object O disposed at the object plane OP on the optical axis AX, and to form a final image IM at an image plane IP. FIG. 4A illustrates a detailed view of the structure and function of catadioptric subsystem 2100.

More specifically, as shown in FIG. 4A, the catadioptric subsystem 2100 consists essentially of the solid optical component 2110 and the baffle 2300. The solid optical component 2110 has an object-side surface 2120 and an image-side surface 2130. On the object-side surface 2120 of the optical component 2100, a dotted line box represents as section CX. The object-side surface 2120 includes a central transmissive region 2121 (object-side transmissive region) between points P11 and P11' centered on the optical axis AX, a curved reflective (or semi-reflective) region 2122 in a zone concentric to the transmissive region 2121 between points P11-P12 and P11'-P12', and a flat reflective region 2123 (object-side flat reflective region) in a rotationally symmetric zone around the transmissive portion 2121 and curved reflective region 2122. The transmissive portion 2121 centered on the optical axis AX is an optically transparent (transmissive) region and serves to transmit therethrough light originated at an object O disposed on the optical axis AX and located at an object plane OP. The reflective portions 2122 and 2123 of the object-side surface 2120 are rendered 100% specularly reflective by, for example, coating the surface with reflective materials, so that 100% of light incident thereupon will be completely reflected.

The image-side surface 2130 includes a central transmissive region 2131 (image-side transmissive region) between points Q11-Q11' centered on the optical axis AX, a curved reflective region 2132 (image-side reflective region) between points Q11-Q12 and Q11'-Q12' in a rotationally symmetric zone around the central transmissive region 2131. The central transmissive region 2131 is a transparent surface devoid of any reflective coatings, so as to transmit light incident thereupon at predetermined incidence angles. The curved reflective region 2132 is rendered specularly reflective preferably by coating a region of the image-side surface 2130 with highly reflective materials, or by any convenient and known process.

In operation, light rays coming from the object O at the object plane OP enter the solid optical element 2110 through the transparent portion 2121 between points P11 and P11' around the optical axis AX. Direct light propagating directly along the optical axis AX is blocked by the baffle 2300. Light rays incoming at a predetermined angle are not blocked by the baffle 230 and advance towards the image-side surface 2130. Accordingly, the incoming light rays undergo a first reflection at the reflective region 2132 between points Q11 and Q12 (Q11' and Q12') on the image-side surface 2130. Reflection of the areas Q11-Q12, Q11'-Q12', P11-P12, and P11'-P12', as illustrated in FIG. 4, is preferably designed to be 100% by using a reflection coating optimized for the wavelength of light being used. Upon being reflected on the reflective region 2132 of the image-side surface 2130, light rays travel toward the object side and are reflected on the flat reflective region 2123 and the curved reflective region 2122 between P11-P12 and P11'-P12', whereby the light rays exit the optical component 2110 through the image-side transmissive portion to form the final image IM on the image plane IP.

Figure 4B:
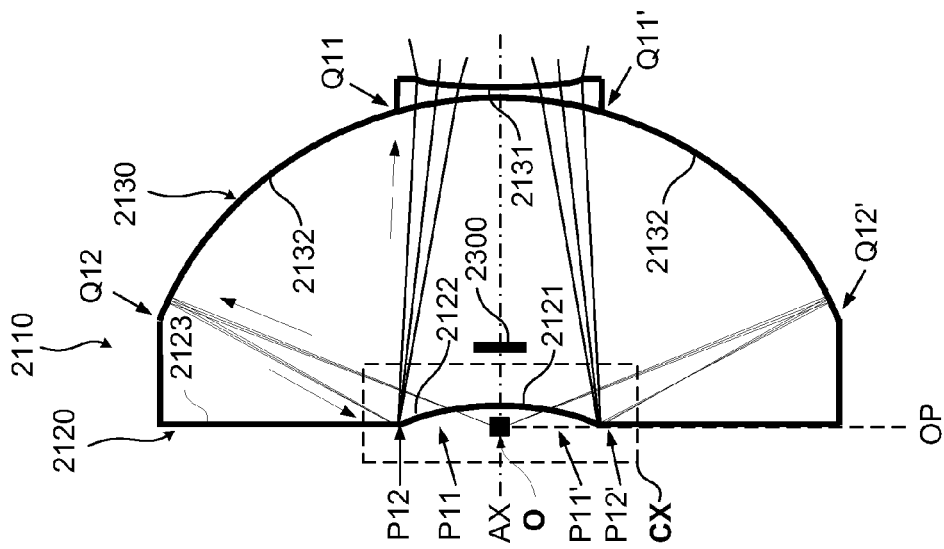

The catadioptric subsystem 2100 structured in this manner can collect light with a numerical aperture of at least 1.65, but suffers of an obscuration ratio of approximately 50%. The MTF of this catadioptric subsystem 2100 (hereinafter, 'structure I') is shown in FIG. 4B. As it can be appreciated from FIG. 4B, the MTF at middle spatial frequencies (between the marks 50 to 200) is particularly low, which may be attributed to the 50% obscuration ratio. Advantageously, however, light efficiency is 75%. Specifically, as used herein, light incident (entering) an optical component or system thereof is considered to have a uniform transmittance at the entrance pupil; this is regarded as 100% and is used at the reference value to determine light efficiency. Therefore, light efficiency of an optical component or system thereof is the amount of light transmittance observed (measured) at a given plane (e.g., the exit pupil plane) as compared to the 100% value observed (measured) at the entrance point thereof.

<Partially Transparent Coating>

A partially transparent coating can be introduced on the object-side surface 2120 of the solid optical component 2110. FIG. 5A illustrates an enlarged view of section CX of the solid optical element 2110 showing a relevant portion of the object-side surface 2120. In FIG. 5A, when reflectance of the area between P24 and P24' is 50%, the light rays from the object O go through the semitransparent surface between P24 and P24', whereby a 50% loss occurs. As described above, the incoming light rays undergo a first reflection on the 100% reflective portion 2132 between Q21-Q22 (Q21'-Q22') on the image-side surface 2130 and travel back towards the object-side surface 2120. Accordingly, this time, 50% of light in the light rays goes through the semitransparent surface between P24-P24', and 50% of light undergoes a second reflection in the semitransparent surface between P24-P24' and travels forward to the transmissive region of the optical component 2110. That is, 50% loss occurs during the reflection on semi-transparent surface between P24 and P24', which means that a total of 75% of the light from the object can be lost. Taking into account of the obscuration by the baffle 2300, light efficiency therefore becomes 23%. The MTF of this structure (hereinafter, 'structure II') is shown in FIG. 5B when the area between P24 and P24' has a 50% reflectance, and it is compared to the MTF of structure I.

Figure 5B:
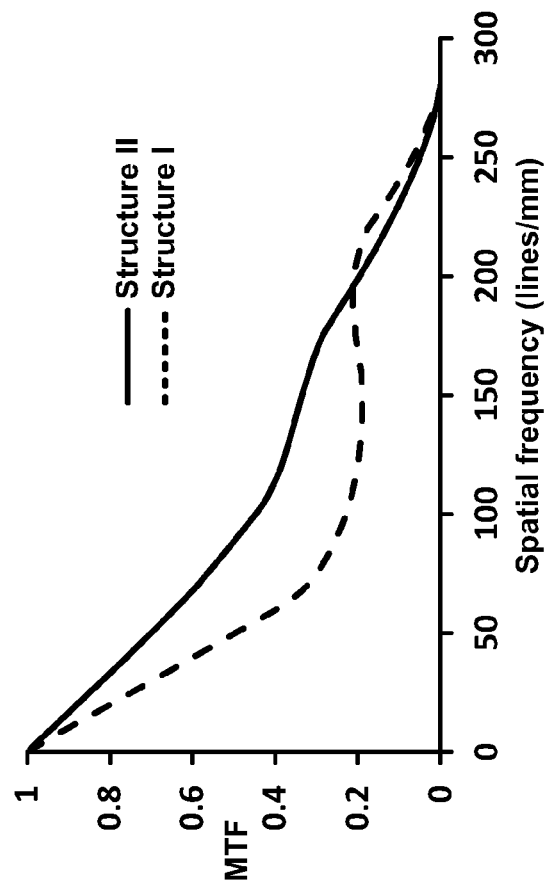
FIGS. 5A and 5B respectively illustrate a catadioptric subsystem having an object-side surface with a semitransparent coating and a MTF thereof.
Figure 5A:
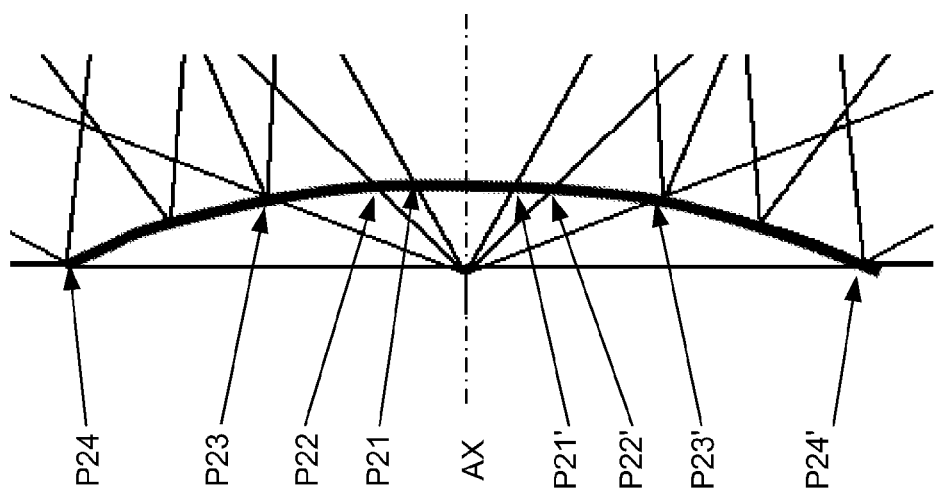

As it can be appreciated from FIG. 5B, although the arrangement of structure II (FIG. 5A) has a 23% light efficiency (i.e., lower than structure I), the MTF has improved at least for spatial frequencies in the middle section of the spatial frequency spectrum. This improvement may be attributable to the fact that the obscuration ratio in structure II is lower than in structure I. That is, according to structure II illustrated in FIG. 5A, the entire region between points P24 and P24' can be used to more effective collect light from the object O at extremely high numerical apertures. Then, after the light is efficiently collected, the entire surface of the semitransparent coating between P24 and P24' is used to reflect light towards the image-surface side, which minimizes the obscuration ratio. In this manner, even if a small percentage of light is blocked by the baffle 2300 and a substantial percentage of light is lost due to the semitransparent coating, obscuration as whole is low.

Figure 6B:
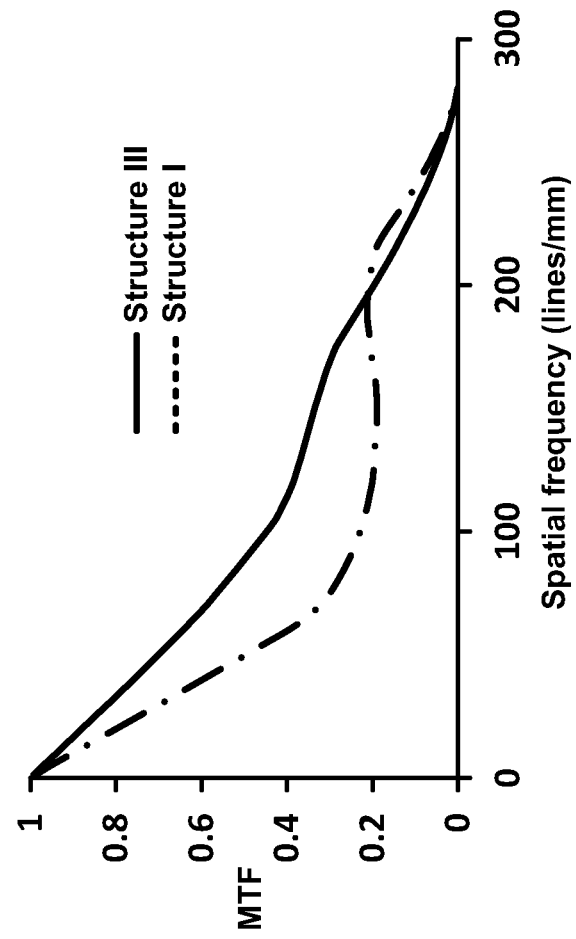
FIGS. 6A and 6B respectively illustrate catadioptric subsystem having an object-side surface with a graded coating and a MTF thereof.
Figure 6A:
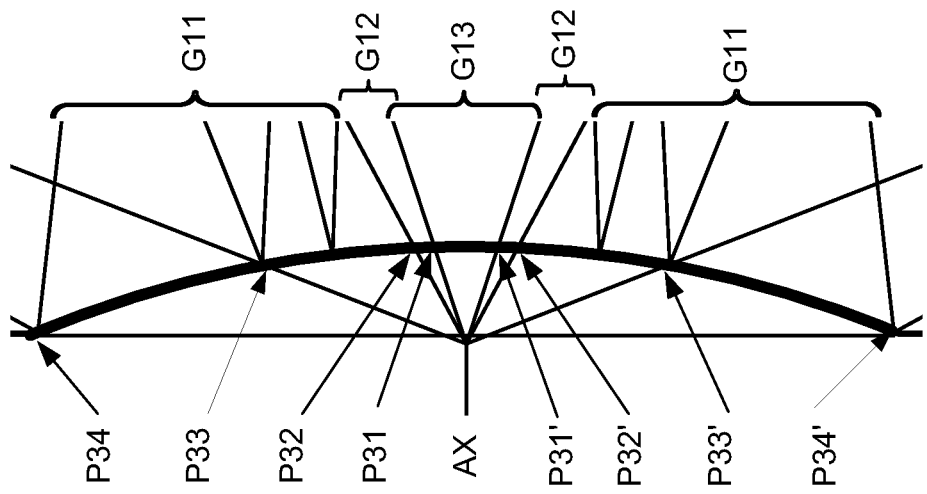

FIG. 6A illustrates another view of section CX (of FIG. 4A), as a further alternative to the transmissive region of the image-side surface 2120. More specifically, in FIG. 6A, the transmissive region of surface 2120 has been coated so that a first area between points P32-P32' has been coated or not coated along the optical axis AX so as to have 0% reflectance; as second area between points P32-P33 (P32'-P33'), around and concentric to the first area, has been coated so as to have 50% reflectance; and a third area between points P33-P34 (P33'-P34') has been coated to have a 100% reflectance. The structure of FIG. 6A, is hereinafter, referred to as 'structure III'. In this structure, when the area between points P32-P32' is 0% reflectance, the area between P32-P33 (P32' and P33') is 50% reflectance, and the area between P33-P34 (P33' and P34') is 100% reflectance, light rays coming from the object O can be divided into three groups G11, G12 and G13.

In FIG. 6A, the group of light rays G11 is between P32-P33 and between P32'-P33', G12 is between P31-P32 and between P31'-P32', and G13 is between P31-P31' on the object-side surface of the optical component 2110. Light rays of group G11 pass through a semitransparent surface in the area between P32-P33 with 50% loss, and are reflected by the reflective region 2132 without any loss. Upon returning to the object-side surface, the group of light rays G11 is reflected towards the image-side surface by the reflective surface in the area between P33-P34.

On the other hand, the group G12 passes through a transparent area between P31-P32 without any loss. Then, upon being reflected by reflective region 2132, the group G12 is reflected towards the image side, by the area between P32-P33 with 50% loss.

Finally, the group G13 passes through an area between P31-P31' but is blocked by the baffle 2300 in order to prevent direct light from reaching the image plane IP. Therefore, the total transmittance of the light in the exit pupil plane is 50% except for the obscured area. The light efficiency in this case is 46%. The MTF of this structure (hereinafter, 'structure III') is shown in FIG. 6B.

Therefore, by using the partially transparent coating such as the structure II (FIG. 5A) and structure III (FIG. 6A), obscuration ratio can be decreased and MTF can be improved. However, light efficiency still may be considered low because it cannot exceed 50%. Accordingly, image contrast may still remain suboptimal for some applications. More specifically, when partially transparent coating films are used as illustrated in FIGS. 5A-5B and 6A-6B, transmissivity distributions at the exit pupil plane (what is called 'apodization') are uniform except for a center portion shielded by the baffle. Transmissivity distributions for the structures II and III around the optical axis are shown in FIGS. 8A and 8B, respectively.

Turning now to FIGS. 7A and 7B, another structure of a semitransparent coating structure (hereinafter, 'structure IV') having a transmissivity distribution in a radial direction is described. As illustrated in FIG. 7A, in order to allow transmissivity distribution to vary in a radial direction of the exit pupil plane, the semitransparent coating is disposed in a manner to be rotationally symmetric along the optical axis AX. Referring to FIG. 7A, the object-side surface 2120 of the solid optical element 2110 (lens) has been distributed into a circular area between points P42 and P42' ("first area") with 0% reflectance, an annular area between points P42-P43 (P42' P43') referred to as "second area' having a 40% reflectance, and an annular area between points P43 P44 (P43' P44') referred to as "third area" with 100% reflectance. In this manner, light rays coming from the object O are effectively divided into four groups G41, G42, G43 and G44. Each group undergoes multiple reflections within the optical element 2110, as follows.

The first group of rays G41 (G41') is composed of rays passing through the region between points P42 and P43 (between P42' and P43'); the second and third groups of light rays G42 and G43 is composed of rays passing through between points P41 and P42 (between P41' and P42'); and the fourth group G44 is composed of rays passing through the region between P41 and P41'.

The light rays in G41 pass through an area between P42 and P43 with 40% loss, and are reflected without any loss by the reflective region 2132 between points Q41 and Q42 of the image side surface 2130. Upon returning to the object-side surface 2120, the group of light rays G41 is reflected on a 100% reflective region between points P43 and P44, whereby these rays are forwarded towards the image side. Accordingly, light in group G41 undergoes an effective loss of no more than 40%.

Rays in group G42 pass through a 100% transmissive region between points P41 and P42 without any loss; these rays are then reflected by the reflective region 2132 of the image-side surface 2130 and returned towards the object-side surface 2120. At the object-side surface, on an area between P43 and P44 the group of light rays G42 is reflected without any loss towards the image-side surface. Accordingly, light rays in group G42 are transmitted through the optical component 2110 essentially undisturbed with an effective 100% transmissivity (0% loss).

Rays in group G43 pass through a transparent region without any loss between points P41 and P42 of the object-side surface 2120. Then, upon being reflected by the reflective region 2132 of the image-side surface 2130, the rays in group G43 are reflected on a semitransparent area between P42 and P43 with 60% loss.

Rays in group G44 pass through an area between P41 and P41' without any loss, but are blocked by the baffle 2300 in order to prevent direct light from reaching the image plane.

Figure 8C:
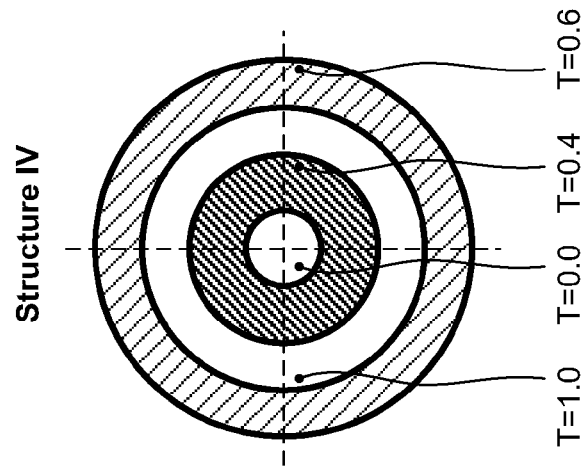
FIGS. 8A, 8B and 8C respectively illustrate transmittance distributions (apodization) at the exit pupil plane of the catadioptric subsystems illustrated in FIGS. 5A, 6A and 7A.
Figure 8B:
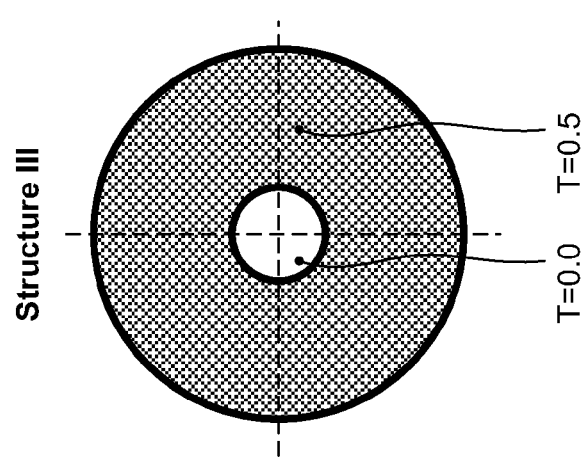
Figure 8A:
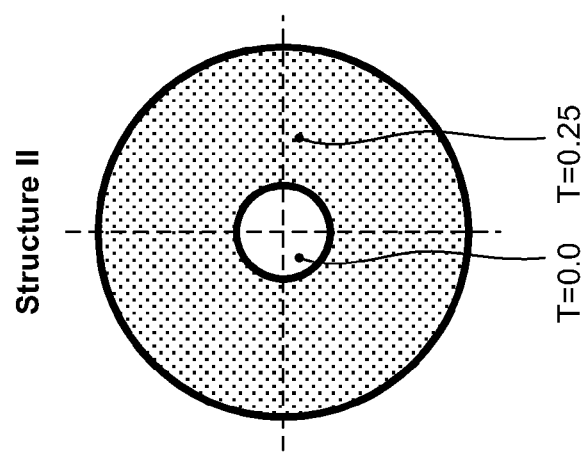

FIGS. 8A, 8B and 8C respectively illustrate the total transmittance distribution of light at the exit pupil plane for structures II, III and IV. In particular, in structure IV (FIG. 8C), light efficiency becomes 68% by using this rotationally symmetric variable transmittance on the object-side surface of the optical element 2110.

Figure 9A:
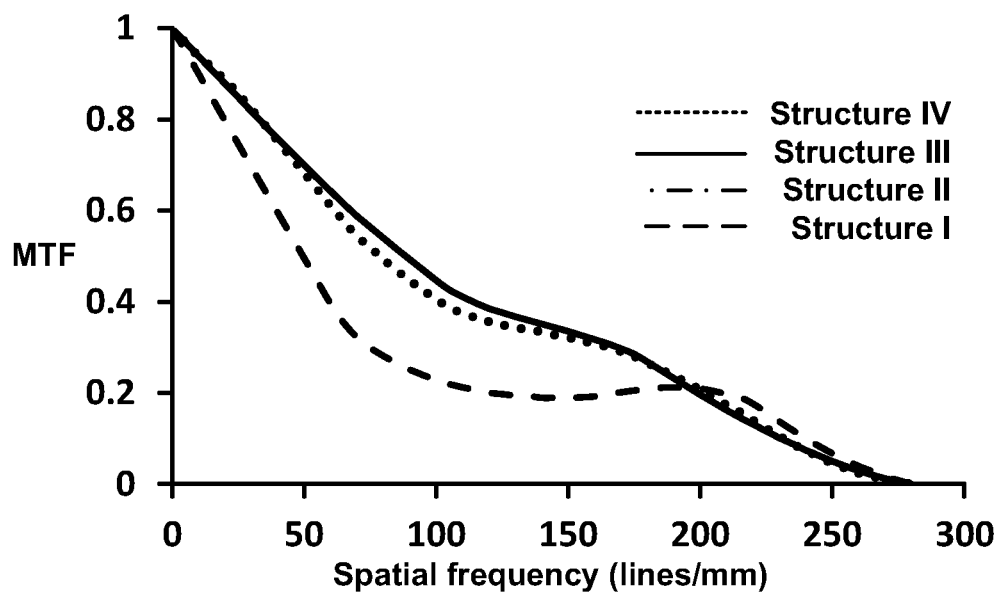
FIG. 9A illustrates a summary of MTFs for the catadioptric subsystems illustrated in FIGS. 4A, 5A, 6A and 7A.

FIG. 9A illustrates a plot of the MTF for structures I through IV. Here, the graphs of the structures II and III substantially overlap each other. As it can be appreciated from FIG. 9A, by providing the object-side surface 2120 of optical element 2110 with rotationally symmetric variable transmittance, the MTF of structure IV improves over structure I. Specifically, by introducing a rotationally symmetric semitransparent coating with 40% reflectance, the MTF is improved even if light efficiency remains at about 50%.

Figure 9B:
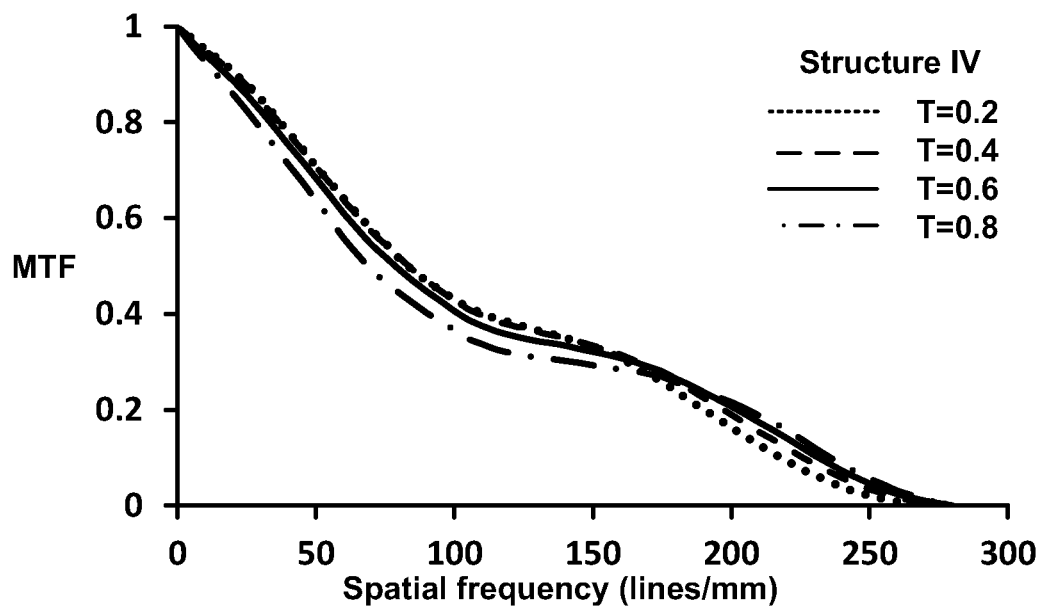
FIG. 9B illustrates the MTF for structure IV at various levels of transmittance.

When the transmittance of the area between P42 and P43 (between P42' and P43') is 20%, 30%, 40%, 70%, and 80%, the light efficiency becomes 65%, 66%, 66%, 68%, 69%, respectively. The MTF feature can be changed according to the transmittance of the area between P42 and P43 as shown in FIG. 9B. FIG. 9B illustrates the MTF for the structure IV at various levels of transmittance. As it can be appreciated from FIG. 9B, by providing the object-side surface 2120 of optical element 2110 with rotationally symmetric variable transmittance, overall the MTF is improved, but even an apparently large increase in transmittance from 20 to 80% in the area between P42 and P43, only improves light efficiency from 65% to 69%.

The partially transparent film may be formed by coating the corresponding part of the surface with reflective materials. Such semitransparent coating may be executed, for example, by chemical vapor deposition or etching The partially transparent film can be selected, for example, from a metal film such as aluminum and silver or a multilayered film. The thickness of the reflective film may be selected, for example, between tens of nanometers and hundreds of micrometers. More specifically, the thickness and material of the reflective film may be chosen in accordance with the wavelength of light to be used. A material of the catadioptric optical element (lens) can be selected, for example, from crown glass, flint glass, abnormal dispersion glass, fused silica, fluorite, etc., including equivalents and combinations thereof.

Exemplary data concerning the radially coated areas of the object-side surface 2120 of the optical element 2110 are summarized in Table 1. In Table 1, the distance in radial direction is assumed to be measured from the optical axis AX towards the edge of the curved surface (points P44 or P44').

TABLE 1

Examplary data for object-side surface 2120 optical element 2110 shown in FIGS. 7A and 7B.

| Area | Distance range in radial direction | Reflectance |
| --- | --- | --- |
| First (AX-P42) | 0 mm to 13.0 mm | 0% |
| Second (P42-P43) | 13.0 mm to 25.3 mm | 40% |
| Third (P43-P44) | 25.3 mm to 48.82 mm | 100% |

The foregoing discussion has been directed namely to the description of the structure and function of the catadioptric subsystem 2100, but more in particular to the transmittance and reflectance properties of the object-side surface 2120 of the solid optical element 2100. In the next section, a detailed description is presented of the manner in which the catadioptric subsystem may be configured.

The first part of the relay system is a catadioptric subsystem 1201 formed by a solid glass (but not necessarily in a single solid piece) optical component and having the feature of having four optical surfaces where light is refracted or reflected.

Figure 10A:
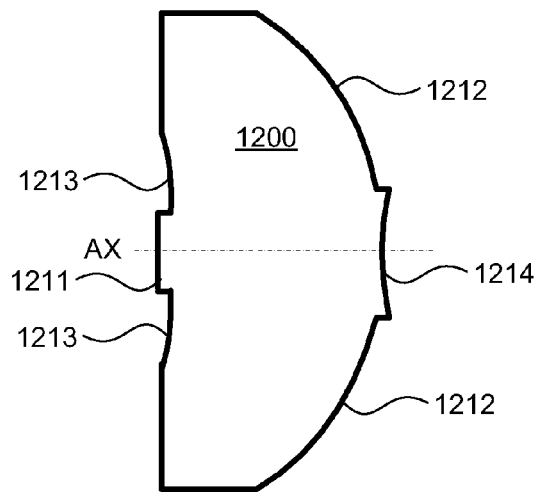
FIG. 10A illustrates a cross-section of a catadioptric subsystem and relevant surfaces thereof where light is refracted or reflected, in accordance with an embodiment of the present invention.

As already mentioned supra, the catadioptric subsystem 2100 may be formed by a solid optical material, for example glass, but not necessarily in a single solid piece. Importantly, the catadioptric subsystem 2100 is constituted by a solid optical component having four optical surfaces (1211, 1212, 1213 and 1214) where light is refracted or reflected. FIG. 10A shows a cross section of a solid glass catadioptric subsystem 1200. In FIG. 10A, the surface 1211 is next to the object and an immersion medium reduces or equalizes the index of refraction of the object space to that of the catadioptric subsystem 1200. The action of the immersion medium is to reduce or nullify the refraction of light rays at surface 1211 coming from the object O and propagating toward surface 1212 of the solid glass catadioptric subsystem 1200. In the case of having an immersion medium with the same index of refraction as the glass in the catadioptric element then there will no refraction. In practice there is always some index of refraction difference and then some refraction will take place.

Surface 1211 can be planar, spherical or aspheric in its optical shape. Surface 1212 is concave, reflective, and is annular as to allow rays to reflect towards surface 1213 in a convergent manner. This annular feature of surface 1212 produces some obscuration which is significant and about 0.3 but it can be smaller or larger. Surface 1213 is a convex annular reflective surface as to allow rays to reflect towards surface 1214 in their way out of the catadioptric subsystem 1200. Surface 1214 is a refractive surface where rays of light exit the catadioptric subsystem. Optical surfaces 1211, 1212, 1213, and 1214 are different (i.e. different from each other in their profile and not a continuation of each other) and can be flat, spherical, or aspheric.

Figure 10B:
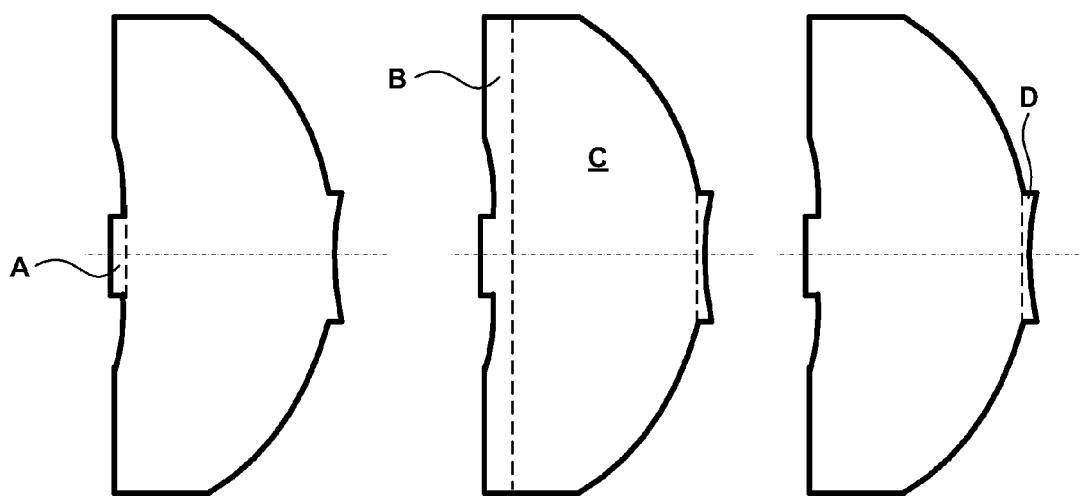
FIG. 10B illustrates an example of a method of fabricating a catadioptric subsystem as solid optical component.

Thus this catadioptric subsystem has four distinct and different surfaces where light reflects or refracts. In particular, surface 1212 form what can be considered an annular mirror concave towards the object side, and the surfaces 1213 form a reflective structure convex towards the image side. The diameter of this catadioptric subsystem 1200 may preferably be between 25 mm and 500 mm. For fabrication purposes the catadioptric subsystem 1200 can be divided in two, three, four, or more parts as shown in FIG. 10B. The catadioptric subsystem 1200 can be made in parts to be assembled and separated at the doted lines (shown in FIG. 10B). In practice the parts would be put together with index matching liquid, curable resin or other known media, a thin gap of air may be allowed between parts thereof, and the cut(s) can be flat or curved. The parts maybe of different materials (glass type) as to help correct some aberrations such as chromatic aberrations, or ease fabrication, and to reduce cost. FIG. 10B illustrates an example where dotted lines show joint sections at places where different parts A, B, C or D can be cemented to form a solid optical component CG.

The catadioptric subsystem 1200 is axially symmetric. In practice there may be some small departures from axial symmetry and flat folding mirrors can be included for packaging purposes. Aspheric surfaces are surfaces that are not spherical in shape and that are known in the art of lens design to help improve image quality or packaging. The catadioptric subsystem 1200 can work at a negative magnification between −3 to −20.

Certain notable aspects of the catadioptric subsystem 1200 are that there is an input surface in contact with an immersion medium. The first surface 1211 may coincide with the inner portion of the third surface 1213. There are two reflective surfaces, namely a concave surface (second surface 1212) on the image side of the catadioptric subsystem and a convex one (third surface 1213) on the opposite side thereof, and there is an exit surface (fourth surface) along the optical axis (or axis of symmetry). The second, third, and fourth surfaces are distinct from each other. The first surface may be also distinct or coincide with the central portion of the third surface.

When the index of refraction is about the same as the glass in the input side (object space) of the catadioptric subsystem 1200, the optical refraction of the first surface will be nullified for a given wavelength. In order to facilitate fabrication, assembly and alignment, it may be preferable to make the first surface coincident with the third surface. The resulting catadioptric system then will have a first input surface portion that is part of the third surface. The portion of that surface that serves as the third surface is reflective and annular, while the inner portion that serves as the first surface is transmissive or has a small amount of reflectivity, for example, 1% to 40% of reflectivity.

Then the catadioptric subsystem 1200 has a second concave annular surface (second surface 1212) and a fourth refractive surface (fourth surface 1214). The fourth surface 1214 is distinct from the second concave reflective surface. Light passes through the center of the annular second surface 1212 in its way to the refracting fourth surface 1214. The portion of the catadioptric subsystem 1200 surrounded by the annular second surface 1212 is mostly transmissive and may have some reflectivity in a direction towards the optical axis AX, for example 1% to 45%.

As mention before for fabrication purposes, or aberration correction purposes, the catadioptric subsystem 1200 may comprise several materials 'cemented together' in any known manner, and having different optical surface as interfaces or joints. However, in any case as a whole, the catadioptric element has an input surface 1211 that is mostly light/radiation transmissive, a concave second surface 1212 that is reflective over an annulus and mostly transmissive over the central portion thereof, a convex third surface 1213 that is reflective over an annulus and mostly transmissive over the central portion thereof, and a refractive fourth surface 1214 that serves as an exit surface and is different from the previous surfaces.

Figure 11:
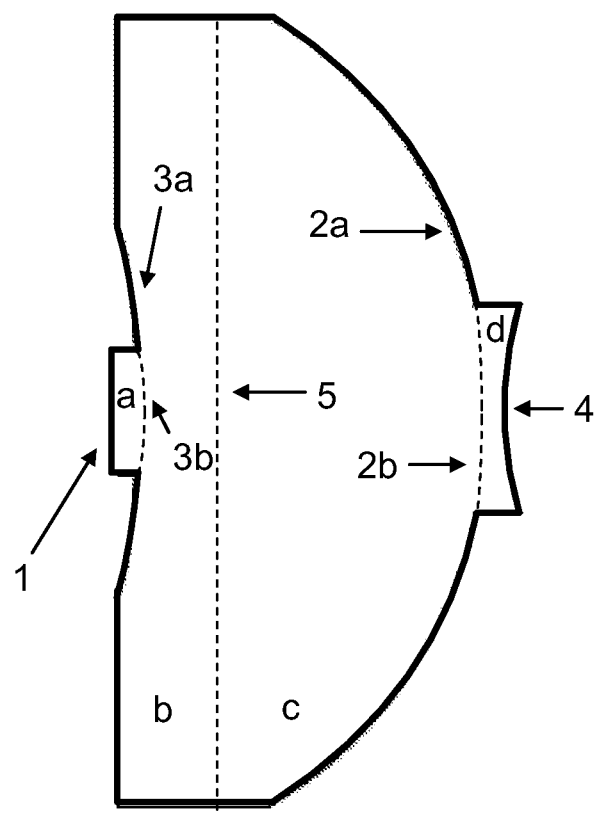
FIG. 11 illustrates a catadioptric subsystem made of four parts assembled together at predetermined joint surfaces, in accordance with an embodiment of the present invention.

FIG. 11 shows the catadioptric subsystem 1200, which can be made of four parts labeled a, b, c, and d. These parts are assembled together at predetermined joint surfaces, which are shown as dotted lines. There are four optical surfaces, 1 is the input optical surface in contact with the immersion fluid, 2*a* and 2*b* show the second optical surface, 3*a* and 3*b* show the third optical surface, and 4 is the output surface. Portion 2*a* of the second surface is fully or highly reflective, and portion 2*b* may be transparent or have a low reflectivity and high transmission; for example 20% reflective and 80% transmissive. Portion 3*a* of the third surface is fully or highly reflective, and portion 3*b* may be transparent or have a low reflectivity and high transmission; for example 20% reflective and 80% transmissive. Surface 4 is the output surface. Dotted surface portions 2*b*, 3*b* and 5 are joints between the parts forming the catadioptric subsystem. The partial reflectivity (or graded) and transmission of surface portions 2*b* and 3*b* prevents the MTF from degrading too much.

Figure 12:
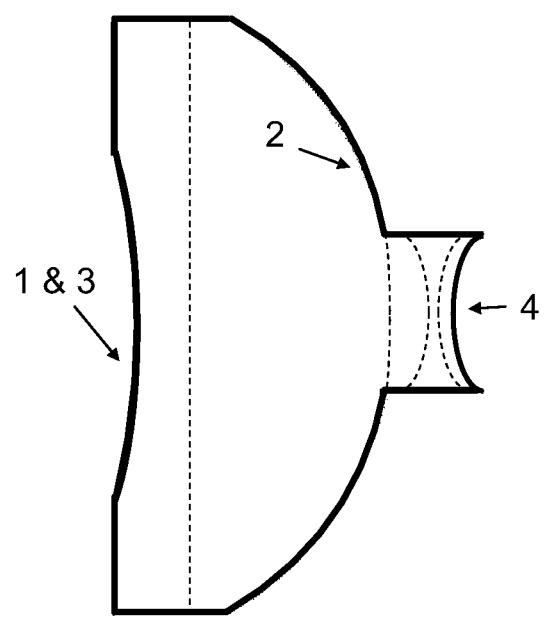
FIG. 12 illustrates an example of the catadioptric subsystem where a region of the image-side surface is coated with a semitransparent coating, in accordance with an embodiment of the present invention.

FIG. 12 shows an example of the catadioptric subsystem 1200 where the first and third surfaces are coincident and coated with a semitransparent coating. The dotted lines represent joint interfaces, joint surfaces, between different parts of the catadioptric subsystem. The dotted lines represent interfaces or joint surfaces between different parts of the catadioptric subsystem formed of as a solid optical element. The concave annular/reflective surface is marked as 2, and the fourth surface (exit) is marked as 4. The fourth surface is distinct and separated from the first, second, and third surfaces.

The actual coating for the semitransparent coating of a partially coating might be a combination of the following types of coatings: 1) Metallic, 2) Dielectric, 3) Transparent, 4) Semi-transparent, 5) Reflective, 6) Semi-reflective, 7) Light blocking (light trap).

Other Embodiments

Figure 13:
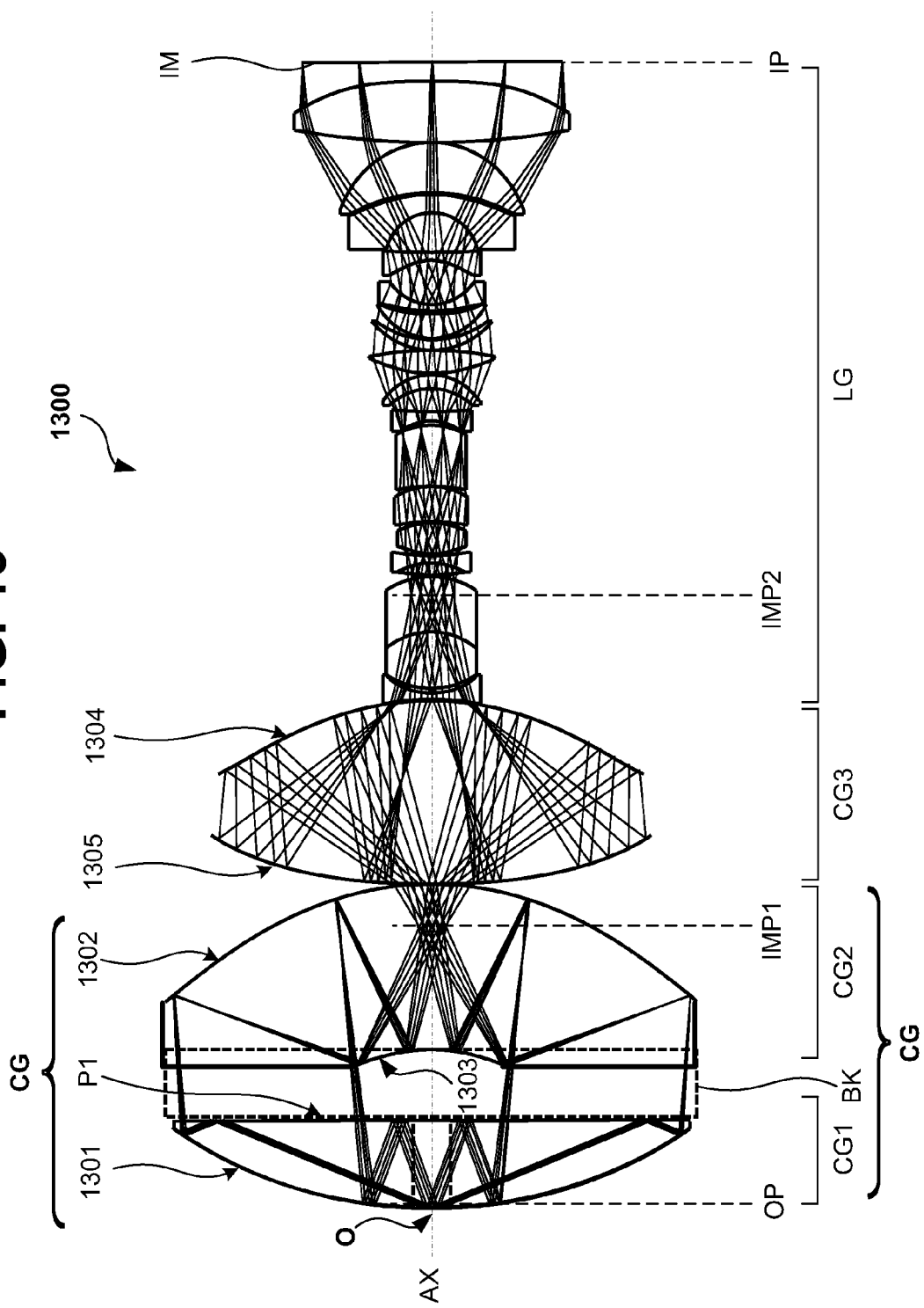
FIG. 13 illustrates an optical system including a catadioptric subsystem CG made of a first catadioptric component CG1 and a second catadioptric component CG2 separated from each other by a predetermined distance, in accordance with an embodiment of the present invention.

A high NA optical system 1300 using TIR (Total Internal Reflection) is illustrated in FIG. 13, in accordance with a further embodiment of the present invention. The detailed lens data for the optical components of optical system 1300 is described in Tables 2a and 2b. In order to form an object-space telecentric system (i.e., a system that has the exit pupil at infinity) an aperture stop STO is considered to be located at the front focal plane of the optical system. In the exemplary optical system illustrated in FIG. 13, an exit pupil plane of the outermost field of view is considered to be located 4875 mm apart from the object plane OP to the left thereof. In the present embodiment, the catadioptric subsystem CG includes a first catadioptric component CG1 and a second catadioptric component CG2 separated from each other by a predetermined distance. The separation (distance) between the first catadioptric component CG1 and the second catadioptric component CG2 can be determined by a block BK, which may be implemented by either leaving an empty space (air gap) or introducing a substantially parallel piece of optically transparent material (for example glass) between CG1 and CG2. Alternatively, the block BK may correspond to an optical filter, a phase plate, or the like. Notably, the separation between CG1 and CG2 may aid in facilitating easy alignment of the system.

The first optical component in FIG. 13 (catadioptric component CG1) and the second component (catadioptric component CG2) may be selectively coated to reduce obscuration and optimize MTF. CG2 is designed to cause two times reflection inside and there is a tiny gap between the first component (CG1) and the second component (CG2). The first component CG1 is configured to collect light coming from the object O, and relay the collected light to the second component CG2 substantially without chromatic aberration. The second component CG2 focuses the collected light onto a first intermediate image plane IMP1 to form a first intermediate image IIM1. More particularly, the combination of the first component CG1 and second component CG2 are specifically configured to control obscuration and optimize the MTF of the optical system 1300.

A third optical component is a catadioptric group CG3 and serves for re-imaging the first intermediate image IIM1 from the first intermediate image plane IMP1 onto a second intermediate image plane IMP2, so at to form a second intermediate image IIM2. The second intermediate image IIM2 serves as the object for a lens group LG, which generates a final image IM at the image plane IP. As illustrated in FIG. 13, the catadioptric group CG3 may be considered as the field lens 300, and the lens group LG may be considered as the re-imaging lens subsystem 400 of FIG. 2.

Figure 14:
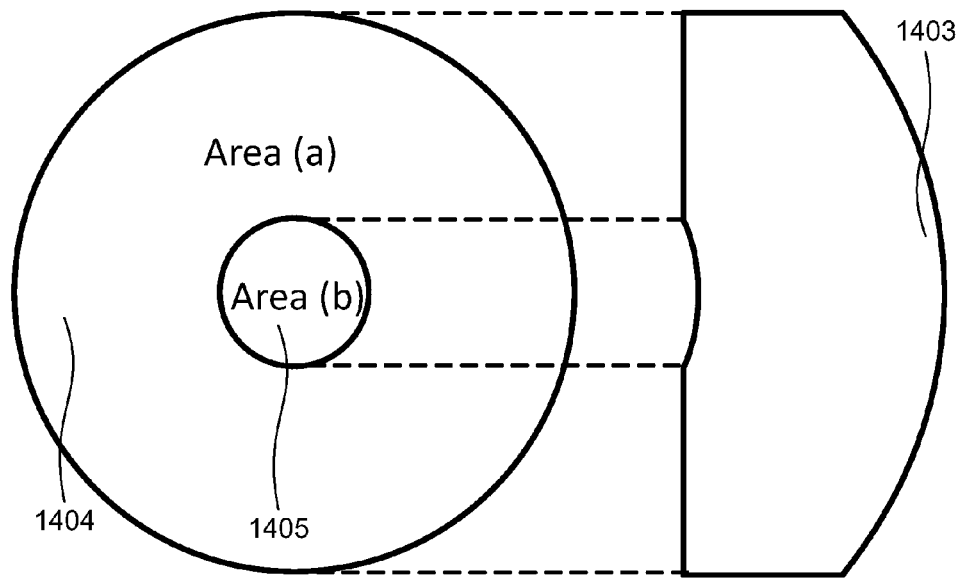
FIG. 14 illustrates an example of the second catadioptric component CG2 of FIG. 13.

FIG. 14 illustrates structural details of the catadioptric component CG2 in catadioptric system CG of FIG. 13. A surface on the left side (object-side surface) of the second group (CG2) has two portions including an outer are area (Area (a)) 1404, which has the same shape of the rear surface (P1) of the first component CG1, and an inner area (Area (b)) 1405 having a convex shape.

Figure 15:
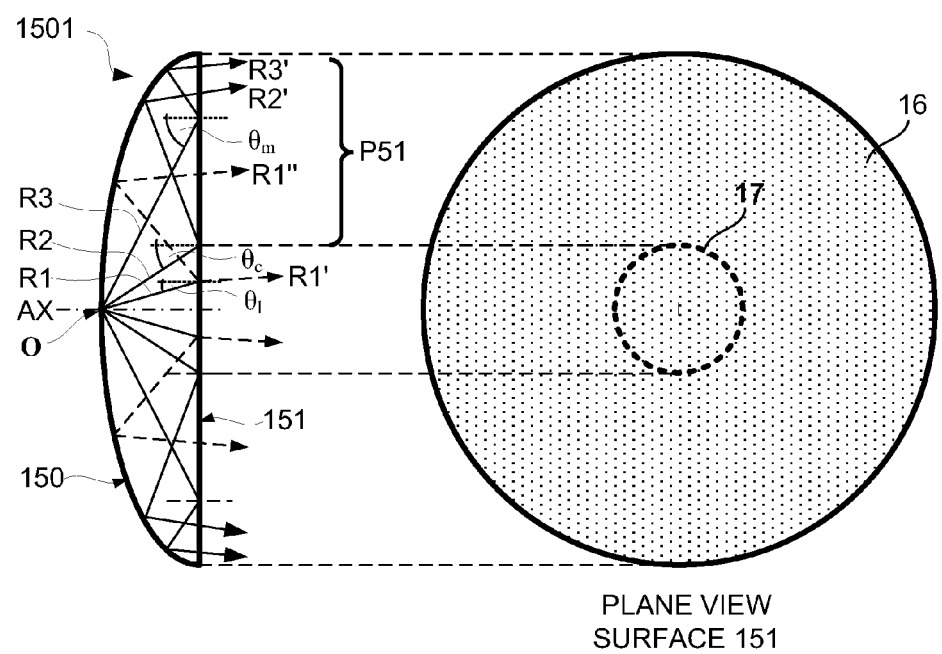
FIG. 15 illustrates an example of the first catadioptric component CG1 of FIG. 13.

FIG. 15 illustrates one example of the first component CG1 consisting of a solid lens 1501 having an object-side curved surface 150 (first surface) and an image-side flat surface 151. A plane view of the flat image-side surface 151 (second surface) of CG1 is shown on the right section of the figure. The object-side surface 150 has a transmissive portion in a central region around the optical axis AX and a concave reflective portion in a region around the transmissive portion. That is, the transmissive portion and the concave reflective portion are concentric to each other. The image-side surface 151 is generally flat and is coated with a semitransparent (50% transmissive) film 16. The image-side surface 151 includes a total internal reflection (TIR) region P51 and a central obscuration region 17, which are concentric to each other and also centered on the optical axis AX. Light rays coming from an object O pass through the transmissive portion of the first surface 150 and impinge first on the image-side surface 151 to be reflected therefrom. More specifically, light rays R2 and R3 having angles of incidence between the critical angle $\theta_c$ and the marginal angle $\theta_m$ undergo total internal reflection on the TIR region P51 of the second surface 151, and are therefore reflected towards the reflective portion of the first surface 150 without any loss. On the other hand, light rays R1 incident on the image-side surface at a lowest obscuration angle $\theta_l$ is partially transmitted through the semi-transparent film 16 as light rays R1', and partially reflected therefrom towards the object-side surface. In turn, the reflective portion of the object-side surface 150 reflects these rays forward towards the second surface 151 as light rays R2' and R3'. This time, all of the reflected rays R1", R2' and R3' are transmitted with 50% loss through the TIR region P51 of the surface 151.

In FIG. 15, light rays R1 propagating through the transmissive region of the first surface 150 and impinging on the region 17 of the second surface 151 are transmitted with 50% as a direct light rays R1'. Accordingly, these direct light rays can be blocked by a baffle, such as the baffle 2300 described above.

Accordingly, referring back to FIG. 13, light rays coming from the object O located at the object plane OP enter the first component CG1 through the central transmissive region thereof, and are reflected on a surface (P1) due to total internal reflection (TIR). Only light rays impinging on surface P1 with an angle of incidence larger than the critical angle are reflected, and travel to the opposite side (1301). From the object-side surface 1301, light rays are reflected towards the image-side surface at an angle smaller than the critical angle. When the rays reach the surface (P1) again, the rays are not reflected but refracted by the surface P1 because the angle of light is less than the critical angle. Next, rays go into the second component (CG2) through the area (a) 1404 shown in FIG. 14. When the light goes out of the surface (P1) of CG1 and into the area (a) of CG2, monochromatic aberrations hardly arise because the shape of the surface (P1) and the shape of area (a) is the same, and difference of the height of light is negligible. Then, rays are converged by the concave reflective surface (image side concave mirror) 1302 and reflected by the convex reflective surface (convex mirror) 1303.

Thereafter, a first intermediate image IIM1 is formed at a first intermediate image plane IMP1 within the second component CG2. Light from the intermediate image IIM1 goes through a transmissive hollow region (hole) of mirror 1305 and is reflected by a mirror 1304. After the reflection by mirror 1305, light rays go through a transmissive hollow region (hole) of the mirror 1304, and a second intermediate image IIM2 is formed at a second intermediate image plane IMP2. The IIM2 serves as the object for the lens group LG. Then, the final image is formed at the image plane IP by the lens group LG. The obscuration ratio determined by the critical angle is 66%. The light efficiency is 63.1%.

When the image-side surface 151 of the lens 1501 is coated by a semitransparent film 16 with 50% reflectance (hereinafter, 'structure VI'), the MTF is improved as compared with the case where the surface 151 is not coated with the semi-transparent film, but the light efficiency drops to 22%. A structure V (not shown) is a structure which has no coating on the image-side surface thereof.

Figure 16A:
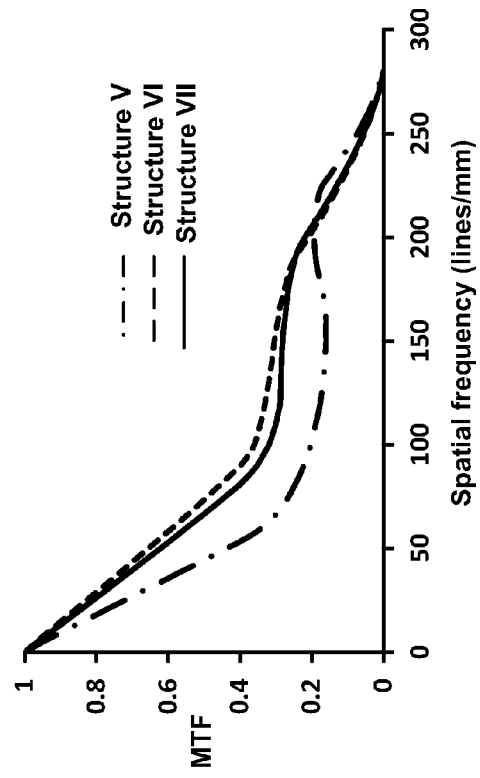
FIG. 16A illustrates a further example of the first component CG1 of FIG. 13 coated with a rotationally symmetric variable transmittance coating film.

Turing now to FIG. 16A, a new structure of CG1 (hereinafter, 'structure VII') is described. In FIG. 16A, the first component CG1 has been modified to include a rotationally symmetric variable coating film, such that an area between P61 and P61' around the optical axis thereof is absorption, an area between P61 and P62 (between P61' and P62') is a 100% reflectance, an area between P62 and P63 (between P62' and P63') is a 50% reflectance, an area between P63 and P64 (between P63' and P64') is a 0% reflectance, and an area between P64 and P65 (between P64' and P65') is 50% reflectance.

Rays coming from the object on the object plane OP are divided into four groups G61, G62, G63 and G64, as shown in FIG. 16. Rays in group G61 are between points P63 and P64 (between P63' and P64'), rays in G62 is between P62 and P63 (between P62' and P63'), rays in G63 is between P61 and P62 (between P61' and P62'), and rays in G64 is between P61 and P61'.

The rays in G61 are reflected by TIR on the area between P63 and P64 and are reflected by an area Q61 and Q62. After that, the rays pass through the area between P64 and P65 with 50% loss. Rays in G62 pass through an area between P62 and P63 with 50% loss and are reflected by an area between Q61 and Q62 without loss. After that, the rays in G62 go through the area between P63 and P64.

Rays in G63 are reflected by an area between P61 and P62 with 100% reflectance coating and is reflected back by the area Q61 and Q62 without loss. Then it passes through the area between P62 and P63 with 50% loss. Rays in G64 is absorbed by an area between P61 and P61'.

Figure 16B:
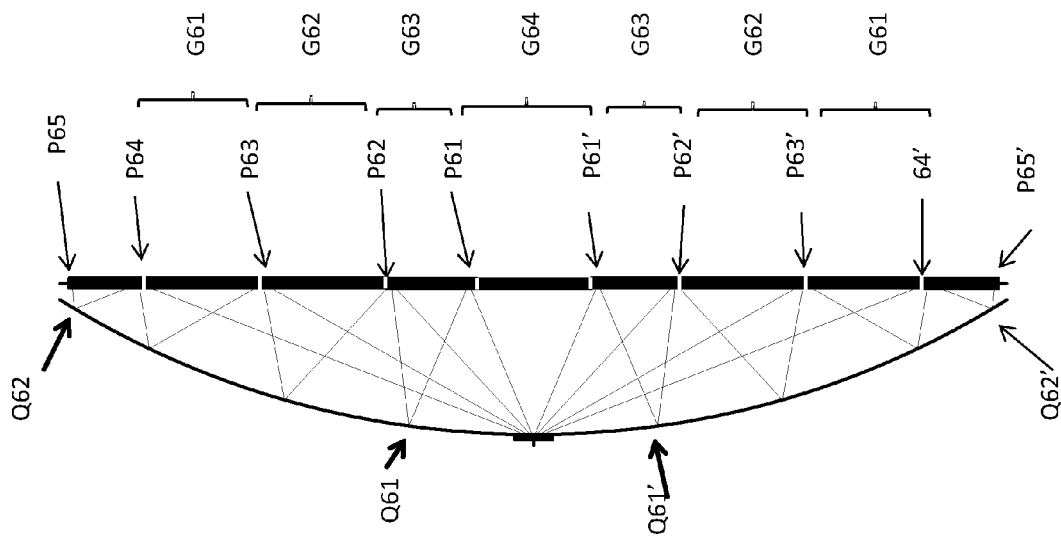
FIG. 16B illustrates a MTF of the first component CG1 of FIG. 16A, in accordance with an embodiment of the present invention.
Figure 17A:
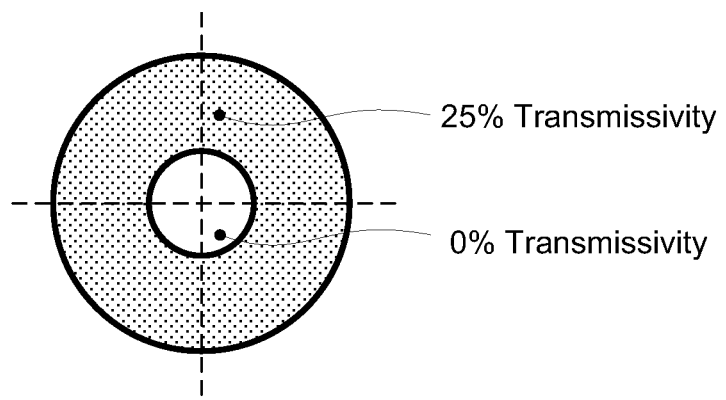
FIGS. 17A and 17B illustrate transmittance distributions at the exit pupil plane for the catadioptric component CG shown in FIG. 13.
Figure 17B:
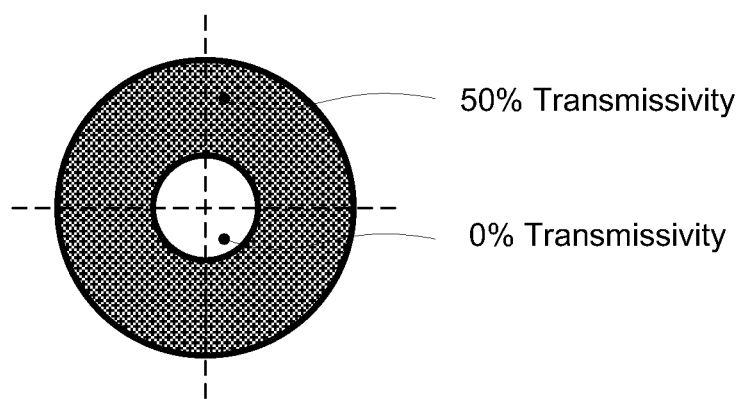

As shown in FIG. 16B, the MTF of the structures VI and VII can be improved by using the semitransparent film. The light efficiency is 22% for the structure VI, and is 42% for the structure VII. FIGS. 17A and 17B respectively show transmittance distribution for structures VI and VII at the exit pupil plane. The transmissivity (transmittance distribution) for the structures VI and VII at the exit pupil plane is 25% and 50%, respectively.

Figure 18:
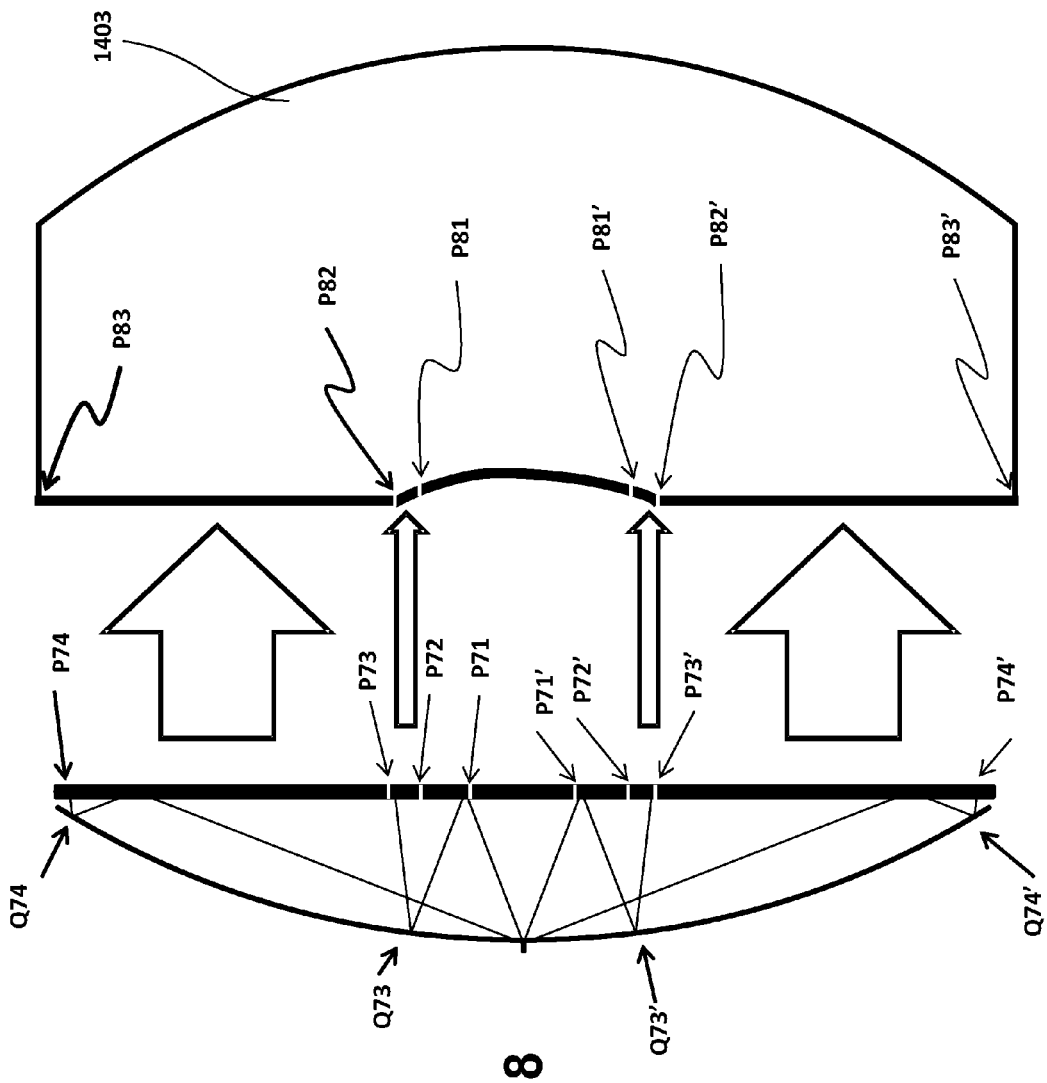
FIG. 18 illustrates a semitransparent coating structure for the first component CG1 and second component CG2 shown in FIG. 13, and exemplary light transmission therein.

A semitransparent coating structure (hereinafter, 'structure VIII') is applied to surfaces of the first and second components (CG1, CG2) as illustrated in FIG. 18. On the first component CG1, the semitransparent coating (50% reflectance) is applied in an area between P72 and P73 (and between P72' and P73'); and a fully reflective coating (100% reflectance) is applied to an area between P71 and P72 (and between P71' and P72'). This is necessary because the obscured area needs to be enlarged in order to increase the MTF. An area between P71 and P71' is an absorption portion which works as a baffle to block (shut off) light traveling toward the image plane without being reflected by the catadioptric optical subsystem. Therefore, according to the structure VIII, the first component CG1 includes on the image-side surface thereof a central absorption region (0% transmissive between P71-P71') that acts as a baffle centered on the optical axis AX, a first annular or ring-shaped region (region between P71-P72 around the absorption region) having 100% reflectance, a second annular or ring-shaped region having 50% reflectance (region between P72-P73 around the first ring-shaped region), and a transmissive region (region between P73-P74 around the second ring-shaped region) having 0% reflectance that may provide total internal reflection to light rays having angle of incidence greater than the critical angle $\theta_c$.

On the object-side surface of the second component CG2, in correspondence with the area between P72 and P73 (and between P72' and P73') with 50% reflectance, a semitransparent coating having 50% reflectance is applied to an area between P81 and P82 (between P81' and P82') at the edge of Area (b) 1405 of CG2 in FIG. 14. An area between P81 and P81' is made specularly reflective (100% reflectance), and areas between P82 and P83 (between P82' and P83') are 0% reflectance (transmissive region).

Rays for the structure VIII are divided into 6 groups (G71, G72, G73, G74, G75, and G76) as illustrated in FIGS. 19A thru 19F. An area between P73 and P74 (between P73' and P74') is 0% reflectance (i.e. no reflective coating). An area P72 and P73 (between P72' and P73') is 50% reflectance, and an area between P71 and P72 (between P71' and P72') is 100% reflectance. An area between P71 and P71' is absorption region. An area between P82 and P84 (between P82' and P84') is 0% reflectance, an area between P81 and P82 (between P81' and P82') is 50% reflectance and an area between P81 and P81' is 100% reflectance.

Figure 19F:
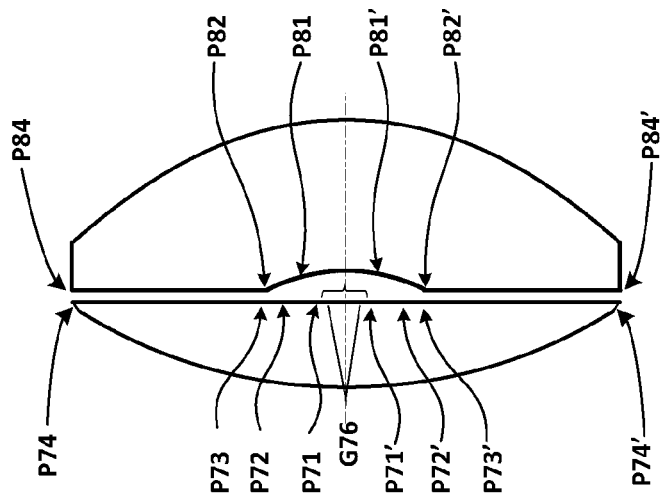
Figure 19E:
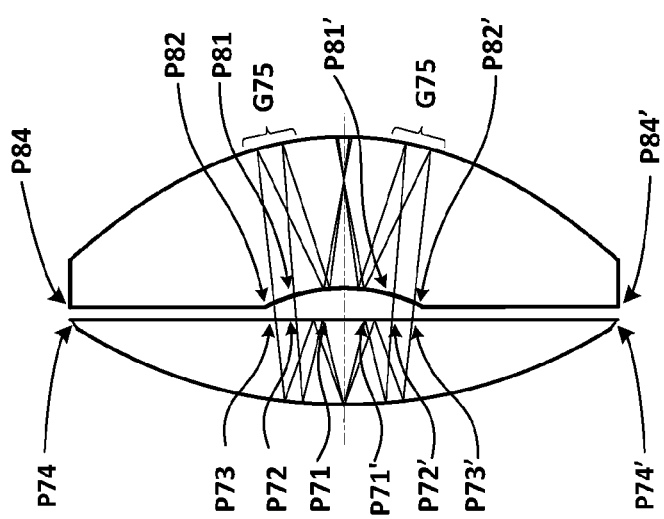
Figure 19D:
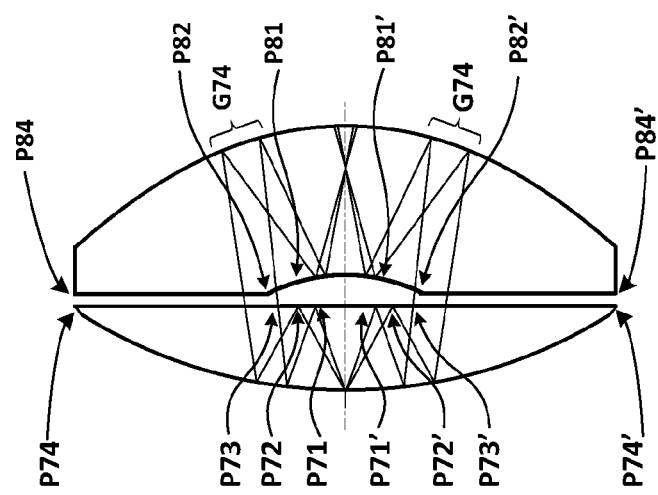

Rays in G71 has 50% energy loss when reflected by the area between P81 and P82 (between P81' and P82') in FIG. 19A. Rays in G72 has no energy loss when reflected a TIR region of the area P73 and P74, and when reflected by the area between P81 and P81' in FIG. 19B. Rays in G73 has 50% loss of energy due to the area between P72 and P73 (between P72' and P73') in FIG. 19C. In FIG. 19D, rays in G74 have no loss of energy. In FIG. 19D, G75 has 75% loss because the light pass through the area between P72 and P73 (between P72' and P73'), and the area between P81 and P82 (between P81' and P82'). As described in FIG. 19F, rays in G76 are blocked by the absorption area, which is 100% loss, between P71 and P71'.

Figure 20A:
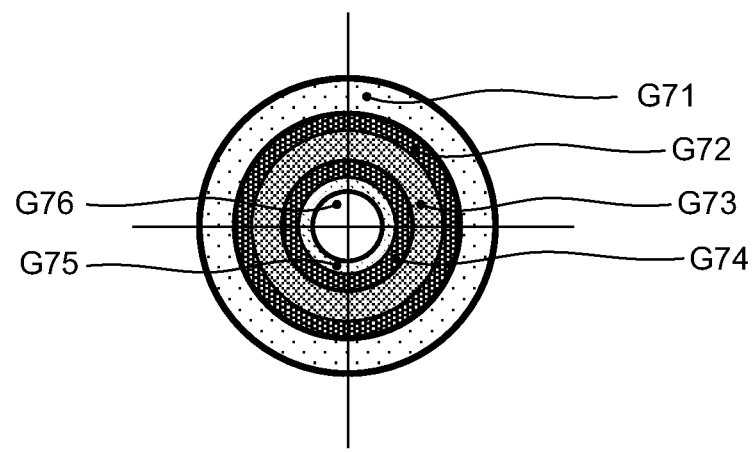
FIG. 20A illustrates a transmittance distribution at the exit pupil plane for the catadioptric subsystem illustrated in FIG. 18.
Figure 20B:
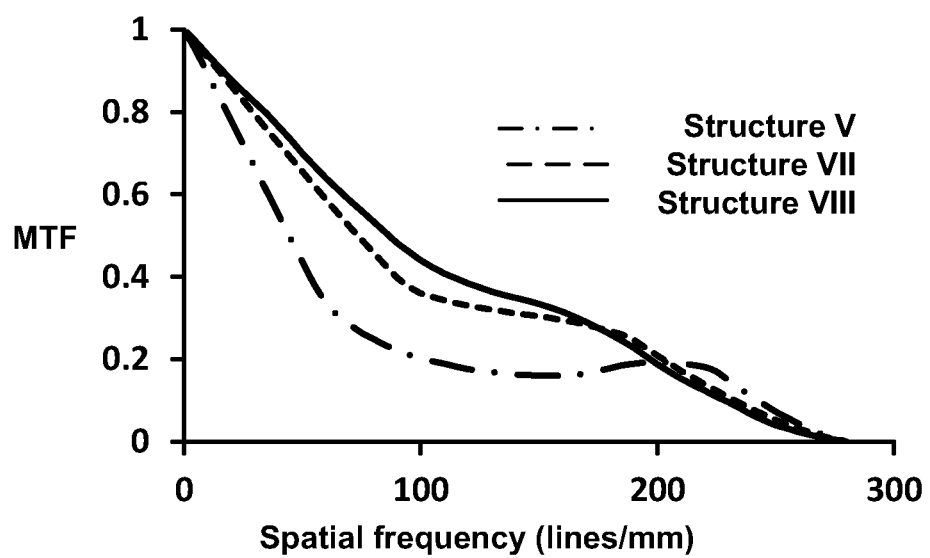
FIG. 20B illustrates a MTF of the catadioptric subsystem having a semitransparent coating structure for the first component CG1 and second component CG2 as illustrated in FIG. 18 as compared to MTFs of a catadioptric subsystem having a semitransparent coating structure only on the first component CG1.

The transmissivity distribution at the exit pupil plane (i.e. 'apodization') is illustrated in FIG. 20A. Each of the transmittance of G71, G72, G73, G74, G75, and G76 is 0.50, 1.00, 0.50, 1.00, 0.25, and 0.00, respectively. By using the semitransparent coating, the MTF of the catadioptric subsystem can be improved as shown in FIG. 20B. The light efficiency for the structure VIII is 58%.

<Field Lens Subsystem>

Figure 21:
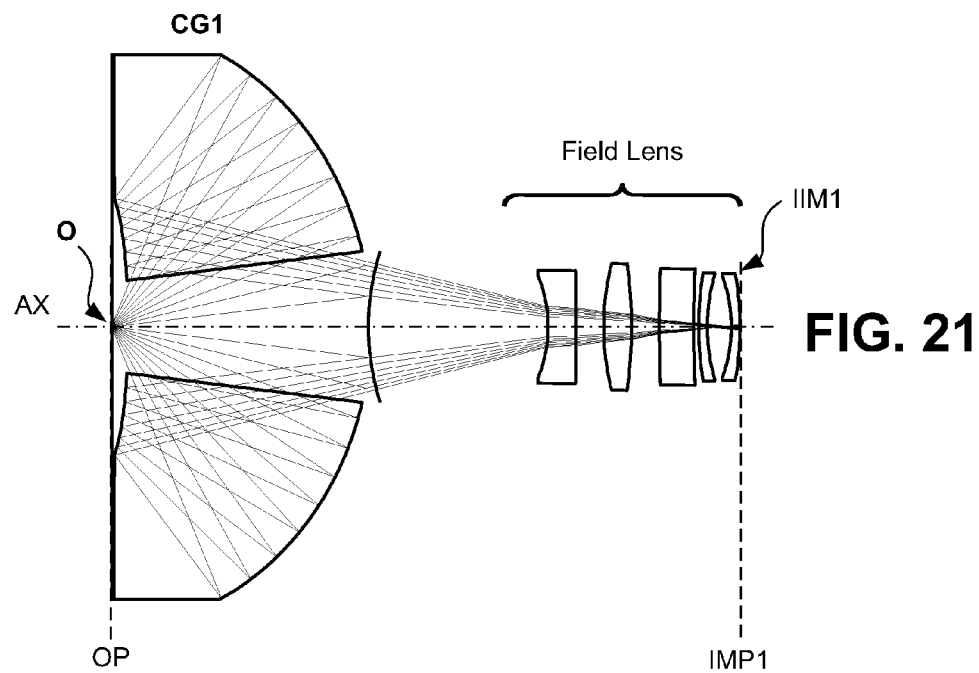
FIG. 21 illustrates an exemplary field lens subsystem.

Referring back to FIG. 2 an example of the field lens 200 will now be described with reference to FIG. 21. In FIG. 21, the field lens subsystem 2200 comprises, located near a first intermediate image, a plurality of refractive optical elements (lenses). More specifically, FIG. 21 illustrates the manner in which the catadioptric subsystem CG1 (described above) relays optical rays from an object plane OP to the field lens to form the first intermediate image IIM1 at the first intermediate image plane IMP1.

<Re-Imaging Lens Sub-System>

Figure 22:
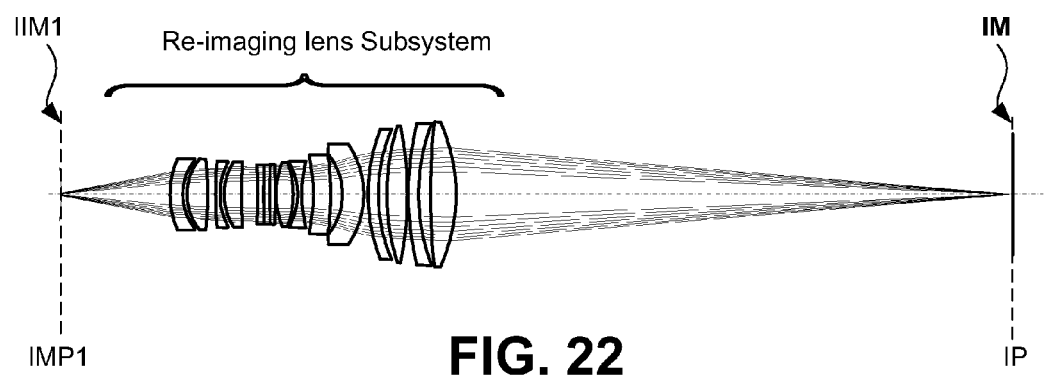
FIG. 22 illustrates an example of a re-imaging lens subsystem.

FIG. 22 represents an example of the re-imaging lens subsystem. This re-imaging lens subsystem comprises several lenses and uses the first intermediate image IIM1 to produce the final image IM (a second image). The magnification of the overall relay can be in the range of 1 to 5, 5 to 25, and 25 to infinity (image at infinity).

NUMERICAL EXAMPLES

Example I

Constructional data for an example of the relay system illustrated in FIG. 2 is given in Appendix I. The wavefront error across the field of view of this system is 0.025 milliwaves.

The summary of characteristics of this optical relay system is as follows.
Numerical aperture object side: 1.65
Object field of view: 7 mm
Wavelength range: 0.41 to 0.68 micrometers.
Maximum diameter: ~318 mm
Length: ~1477 mm
Magnification: 20
Obscuration ratio: ~0.3
Telecentricity: In object space.
Polychromatic RMS wavefront residual over the field of view: 0.025 waves.

Example II

Figure 23A:
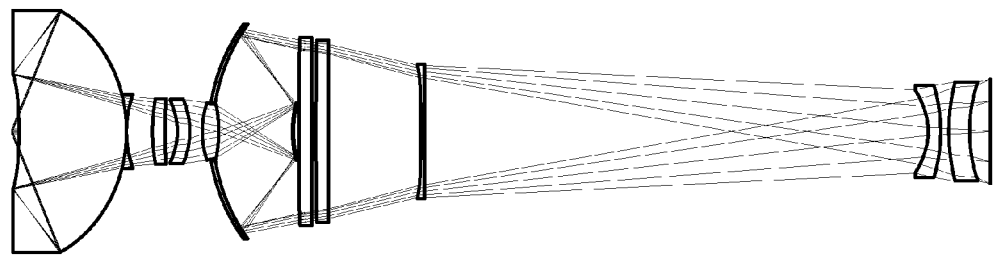
FIGS. 23A through 23D illustrate various examples of an optical system equipped with a catadioptric subsystem, in accordance with numerical examples corresponding to Appendices I through V disclosed herein.

Constructional data for a second numerical example, as shown in FIG. 23A, is provided in Appendix II. Numerical aperture object side: 1.65
Object field of view: 7 mm
Wavelength range: 0.46 to 0.66 micrometers.
Maximum diameter: ~318 mm
Length: ~1264 mm
Magnification: 20

Obscuration ratio: ~0.3
Telecentricity: In object space.
Polychromatic RMS wavefront residual over the field of view: 0.014 waves

Example III

Figure 23B:
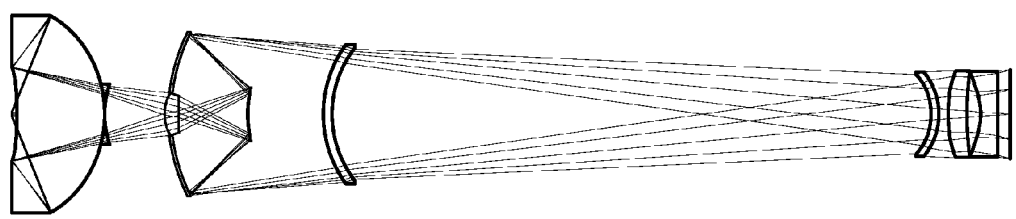

FIG. 23B shows the layout structure of a third example. Constructional data for the example of FIG. 23B is provided in Appendix III.

Example IV

Figure 23C:
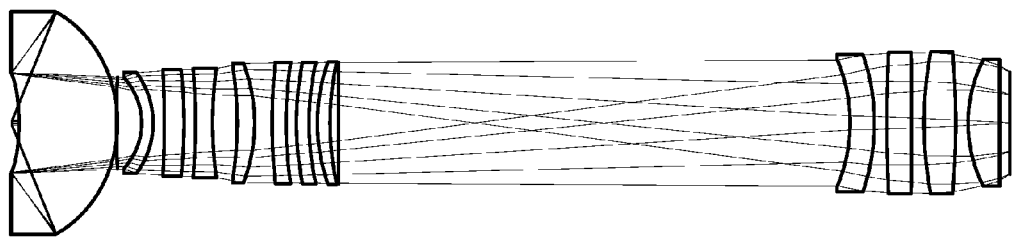

FIG. 23C shows a relay optical system with a magnification of −20. Appendix IV provides the prescription data for the example shown in FIG. 23C. Polychromatic RMS wavefront residual over the field of view is 0.048 waves. The numerical aperture is 1.65, the field of view is 7.0 mm, the wavefront correction is polychromatic, and the relay is telecentric in the object space.

Example V

Figure 23D:
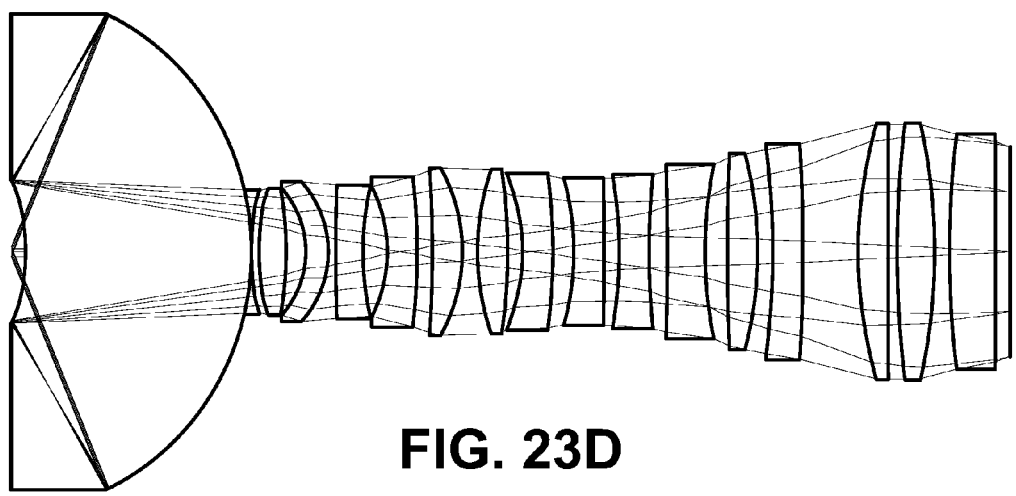

FIG. 23D illustrates an example of a relay system with negative magnification and that has no intermediate image. A notable feature of this example is that the length of system is 662 mm. FIG. 23D shows the cross section of the relay with a magnification of −20. Appendix V provides the prescription data for Example V of FIG. 23D. Polychromatic RMS wavefront residual over the field of view is 0.048 waves. The numerical aperture is 1.65, the field of view is 7.0 mm, the wavefront correction is polychromatic, and the relay is telecentric in object space.

Data corresponding to the catadioptric optical systems illustrated in FIGS. 3 and 13 are presented in Tables 1a and 1b for FIG. 3 and Tables 2a and 2b for FIG. 13. In each of FIGS. 3 and 13, the reference indicia "i" (where i=1, 2, 3 . . . ) denotes the order of surfaces in the optical system from the object plane OP to the image plane IP. With this premise, the "Radius" data Ri corresponds to an ith radius of curvature (at the ith plane); thickness Ti denotes an on-axis distance or space between the ith and (i+1)th surface; the reference ndi and vdi respectively denote the index of refraction and Abbe number of the material of the ith optical element with respect to the Fraunhoffer d-line. A surface number without data for ndi and vdi indicates that this surface number represents an air space. A radius R=1.00E+18 (where 1E+X is equivalent to $1 \times 10^{+X}$) denotes a substantially infinite radius, i.e., a flat surface. In addition, in each numerical example, it is assumed that the object O is located on the object side of the first optical surface and at an object plane OP and on the optical axis AX; that is, the object O is assumed to be in axial alignment with the optical system. An aperture stop is assumed located at a relative far distance from object O so that the object space can be considered substantially telecentric. In each numerical example, the object O is considered to be immersed in a fluid with a refractive index matching the refractive index of the first optical element.

TABLE 1a

Lens Data for the system illustrated in FIG. 3.

| Surface | Radius | Thickness | Index | Abbe Number |
|---|---|---|---|---|
| 1 | 1.00E+18 | 1.000 | 1.773 | 49.57 |
| 2 | 1.00E+18 | 9.822 | 1.773 | 49.57 |
| 3 | −149.125 | 20.000 | 1.773 | 49.57 |
| 4 | 1.00E+18 | 130.000 | 1.773 | 49.57 |
| 5 | −183.693 | −130.000 | 1.773 | 49.57 |
| 6 | 1.00E+18 | −20.000 | 1.773 | 49.57 |
| 7 | −149.125 | 20.000 | 1.773 | 49.57 |
| 8 | 1.00E+18 | 130.000 | 1.773 | 49.57 |
| 9 | −183.693 | 5.000 | 1.773 | 49.57 |
| 10 | 310.607 | 15.000 | | |
| 11 | −177.612 | 18.000 | 1.517 | 64.17 |
| 12 | −99.863 | 3.000 | | |
| 13 | −109.197 | 11.000 | 1.773 | 49.57 |
| 14 | 5634.662 | 14.000 | | |
| 15 | −1288.851 | 26.000 | 1.773 | 49.57 |
| 16 | −82.965 | 3.000 | | |
| 17 | −451.304 | 20.000 | 1.773 | 49.57 |
| 18 | −423.772 | 10.000 | | |
| 19 | 408.552 | 10.000 | 1.773 | 49.57 |
| 20 | 99.953 | 12.000 | | |
| 21 | 346.336 | 20.000 | 1.773 | 49.57 |
| 22 | −192.462 | 14.000 | | |
| 23 | −187.553 | 10.000 | 1.773 | 49.57 |
| 24 | 120.606 | 28.000 | | |
| 25 | −280.828 | 20.000 | 1.773 | 49.57 |
| 26 | −170.465 | 6.000 | | |
| 27 | 96.862 | 20.000 | 1.773 | 49.57 |
| 28 | 113.678 | 26.900 | | |
| 29 | −127.625 | 15.000 | 1.773 | 49.57 |
| 30 | 1513.669 | 25.800 | | |
| 31 | 410.846 | 30.000 | 1.773 | 49.57 |
| 32 | 1430.002 | 10.000 | | |
| 33 | 112.080 | 20.000 | 1.773 | 49.57 |
| 34 | 200.071 | 37.000 | | |
| 35 | 415.695 | 20.000 | 1.773 | 49.57 |
| 36 | 353.366 | 6.000 | | |
| 37 | 296.588 | 40.000 | 1.773 | 49.57 |
| 38 | −261.340 | 10.000 | | |
| IM | 1.00E+18 | 0.000 | | |

TABLE 1b

Data for aspherical surfaces of the system illustrated in FIG. 3

| Surface | k | A | B | C | D | E | F | G |
|---|---|---|---|---|---|---|---|---|
| 3, 7 | 5.95E+00 | 3.23E−08 | 1.85E−11 | −3.84E−16 | 4.08E−18 | −7.50E−22 | −4.87E−27 | 8.22E−29 |
| 5, 9 | 1.12E−01 | 5.70E−10 | 8.90E−15 | 8.90E−19 | −7.08E−23 | 5.30E−27 | −1.79E−31 | 2.82E−36 |
| 10 | 0.00E+00 | 5.95E−08 | −2.72E−11 | 5.37E−14 | 4.96E−17 | 6.04E−21 | 9.42E−24 | −3.57E−27 |
| 11 | 0.00E+00 | 1.78E−06 | −8.13E−10 | 3.09E−15 | 2.97E−17 | 9.53E−20 | −5.50E−23 | 1.06E−26 |
| 13 | 0.00E+00 | −1.46E−06 | 2.68E−10 | 2.88E−13 | 1.01E−17 | −7.43E−20 | 1.49E−23 | 1.03E−27 |
| 14 | 0.00E+00 | 6.30E−07 | 2.41E−11 | 3.95E−14 | −3.03E−17 | −2.48E−21 | 3.00E−24 | −1.76E−28 |
| 19 | 0.00E+00 | −5.76E−08 | 6.29E−12 | −5.37E−14 | 2.47E−17 | −9.09E−21 | 3.27E−24 | −4.21E−28 |
| 23 | 0.00E+00 | 1.20E−06 | −1.83E−10 | 1.23E−13 | −4.32E−17 | 3.06E−21 | 8.79E−25 | −2.30E−28 |
| 25 | 0.00E+00 | 4.29E−07 | −1.76E−10 | 2.89E−14 | 1.31E−18 | −1.28E−20 | 6.93E−24 | −9.33E−28 |
| 26 | 0.00E+00 | 3.73E−07 | −3.19E−11 | 7.50E−16 | −1.34E−18 | −1.77E−21 | 2.46E−25 | 6.60E−29 |

TABLE 1b-continued

Data for aspherical surfaces of the system illustrated in FIG. 3

| Surface | k | A | B | C | D | E | F | G |
|---|---|---|---|---|---|---|---|---|
| 30 | 0.00E+00 | 1.10E−07 | −1.38E−10 | 3.32E−14 | −3.57E−20 | −1.93E−21 | 6.77E−25 | −7.88E−29 |
| 35 | 0.00E+00 | −2.63E−07 | −1.36E−10 | 1.53E−14 | 3.12E−18 | −5.38E−22 | 1.28E−26 | 9.22E−31 |
| 37 | 0.00E+00 | 6.50E−08 | 1.48E−10 | −4.56E−14 | 6.07E−18 | −2.12E−22 | −2.58E−26 | 2.30E−30 |
| 38 | 0.00E+00 | −1.49E−07 | −2.79E−12 | 1.77E−14 | −3.18E−18 | 6.97E−23 | 4.17E−26 | −3.31E−30 |

In each aspheric surface, a conic constant is denoted by k (where k is a number that describes a conic surface, being zero for a sphere, −1 for a paraboloid, and with other values to describe any conic of revolution); aspherical polynomial order coefficients are denoted by A, B, C, D, E, F, G, J . . . which are $4^{th}, 6^{th}, 8^{th}, 10^{th}, 12^{th}, 14^{th}$ and $16^{th}$ order coefficient respectively; and a displacement in the direction of the optical axis at a position of height h from the optical axis is denoted by z with reference to an apex of the surface. The displacement in the aspherical surface is based on Equation (2) given below:

$$z = \frac{ch^2}{1 + \sqrt{1 - (1+k)c^2 h^2}} + Ah^4 + Bh^6 + Ch^8 + Dh^{10} + Eh^{12} + Fh^{14} + Gh^{16} + Hh^{18} + Jh^{20} + \ldots$$

TABLE 2a

Lens Data for the catadioptric system illustrated in FIG. 13

| Surface | Radius | Thickness | Index | Abbe Number |
|---|---|---|---|---|
| 1 | 1.00E+18 | 1.000 | 1.773 | 38.57 |
| 2 | 274.4681 | 45.000 | 1.773 | 38.57 |
| 3 | 1.00E+18 | −45.000 | 1.773 | 38.57 |
| 4 | 274.4681 | 45.000 | 1.773 | 38.57 |
| 5 | 1.00E+18 | 0.050 | | |
| 6 | 1.00E+18 | 0.000 | 1.773 | 49.56 |
| 7 | 1.00E+18 | 16.888 | 1.773 | 49.56 |
| 8 | 1.00E+18 | 80.106 | 1.773 | 49.56 |
| 9 | −165.827 | −80.106 | 1.773 | 49.56 |
| 10 | −81.0422 | 80.106 | 1.773 | 49.56 |
| 11 | −165.827 | 0.500 | 1.773 | 49.56 |
| 12 | 369.4094 | 94.151 | | |
| 13 | −168.955 | −94.151 | | |
| 14 | 369.4094 | 94.151 | | |
| 15 | −168.955 | 0.500 | | |
| 16 | 54.20592 | 3.000 | 1.572 | 42.76 |
| 17 | 27.13616 | 6.908 | | |
| 18 | −33.8095 | 16.748 | 1.487 | 70.41 |
| 19 | −14.4711 | 6.993 | 1.749 | 34.26 |
| 20 | −22.7417 | 0.500 | | |
| 21 | 56.3764 | 9.638 | 1.744 | 44.85 |
| 22 | −23.1721 | 3.000 | 1.755 | 27.58 |
| 23 | 55.606 | 0.500 | | |
| 24 | 25.58774 | 9.385 | 1.713 | 47.52 |
| 25 | −48.7166 | 1.500 | | |
| 26 | −1005.24 | 13.737 | 1.718 | 29.24 |
| 27 | −40.7015 | 0.500 | | |
| 28 | −61.9495 | 25.595 | 1.755 | 27.58 |
| 29 | −35.1546 | 2.247 | | |
| 30 | −17.9756 | 3.000 | 1.487 | 70.41 |
| 31 | −61.6773 | 3.530 | | |
| 32 | −26.5768 | 12.215 | 1.755 | 27.58 |
| 33 | −32.199 | 0.500 | | |
| 34 | 62.30761 | 9.790 | 1.755 | 27.58 |
| 35 | −280.605 | 0.500 | | |
| 36 | 32.1044 | 8.730 | 1.744 | 44.85 |
| 37 | 51.56093 | 1.481 | | |
| 38 | 58.69976 | 3.000 | 1.754 | 29.19 |
| 39 | 95.60039 | 0.500 | | |
| 40 | 40.97178 | 5.412 | 1.744 | 44.85 |
| 43 | 27.44991 | 15.703 | | |
| 44 | −26.048 | 3.000 | 1.569 | 61.41 |
| 45 | −118.638 | 15.765 | | |
| 46 | −22.264 | 3.000 | 1.755 | 27.58 |
| 47 | −97.1871 | 0.500 | | |
| 48 | −108.872 | 35.641 | 1.495 | 69.55 |
| 49 | −44.0456 | 0.500 | | |
| 50 | 530.1737 | 28.788 | 1.755 | 28.04 |
| 51 | −264.831 | 10.000 | | |
| IM | 1.00E+18 | 0.000 | | |

TABLE 2b

Data for aspherical surface of the system illustrated in FIG. FIG. 13

| Surface | k | A | B | C | D | E | F | G |
|---|---|---|---|---|---|---|---|---|
| 2, 4 | 3.17E−01 | 6.83E−09 | −5.23E−13 | 2.36E−17 | −8.47E−22 | 1.98E−26 | −2.75E−31 | 0.00E+00 |
| 9, 11 | −4.69E−01 | 1.75E−09 | 2.87E−13 | 1.13E−17 | 1.15E−22 | 1.15E−26 | −1.26E−30 | 2.11E−35 |
| 10 | 1.92E+00 | 1.26E−06 | 1.49E−12 | −1.35E−14 | 2.23E−17 | 1.72E−20 | −1.17E−23 | 3.79E−27 |
| 12, 14 | 1.47E−01 | 4.90E−08 | −2.25E−12 | 2.87E−16 | −2.44E−20 | 1.66E−24 | −6.70E−29 | 1.34E−33 |
| 13, 15 | −6.89E−04 | 2.24E−08 | 1.35E−12 | 5.53E−17 | 3.19E−21 | 3.19E−26 | 6.15E−30 | −2.89E−34 |
| 17 | 0.00E+00 | 1.69E−06 | 6.04E−09 | 4.05E−11 | −1.76E−13 | −4.19E−32 | 1.09E−31 | 4.46E−23 |
| 21 | 0.00E+00 | 2.51E−06 | −1.42E−08 | 5.99E−12 | −1.29E−15 | −4.78E−33 | −6.05E−32 | −1.12E−27 |
| 24 | 0.00E+00 | −1.57E−05 | −3.66E−09 | −1.31E−11 | −8.93E−15 | −2.38E−32 | −1.48E−31 | −9.16E−24 |
| 30 | 0.00E+00 | 4.08E−05 | 5.99E−08 | −1.97E−10 | 5.63E−13 | 8.12E−34 | −1.02E−31 | −5.07E−31 |
| 34 | 0.00E+00 | −4.87E−07 | 4.08E−09 | −7.65E−12 | 5.86E−15 | −3.66E−32 | −3.19E−21 | 1.53E−24 |
| 39 | 0.00E+00 | 1.30E−05 | 3.85E−09 | −2.85E−12 | 9.32E−15 | −1.11E−31 | −6.12E−24 | 2.41E−23 |
| 42 | 0.00E+00 | 7.81E−06 | 1.02E−08 | 5.20E−12 | 3.00E−14 | −9.93E−32 | 1.95E−26 | 1.61E−22 |
| 45 | 0.00E+00 | 3.13E−07 | 2.17E−11 | −1.81E−13 | 8.81E−17 | −1.87E−30 | −2.66E−23 | 9.77E−27 |
| 49 | 0.00E+00 | −3.68E−07 | −1.49E−10 | 8.15E−14 | −1.83E−17 | 2.09E−21 | −1.05E−25 | 8.96E−31 |

APPENDIX I

| Surface | Radius | Thickness | Material |
|---|---|---|---|
| 1 | 1.00E+18 | 1 | LAFN28 |
| 2 | 1.00E+18 | 9.769 | LAFN28 |
| 3 | −602.746 | 140.000 | LAFN28 |
| 4 | −197.988 | −141.350 | MIRROR |
| 5 | −602.746 | 141.350 | MIRROR |
| 6 | −198.000 | −1.350 | LAFN28 |
| 7 | 136.882 | 104.588 | |
| 8 | −78.588 | 16.154 | LAFN28 |
| 9 | −2085.368 | 16.154 | |
| 10 | 149.534 | 16.154 | LAFN28 |
| 11 | −270.835 | 16.154 | |
| 12 | 678.774 | 20.000 | LAFN28 |
| 13 | 865.890 | 3.000 | |
| 14 | 195.610 | 5.000 | SF4 |
| 15 | 108.781 | 14.000 | KZFS1 |
| 16 | −86.601 | 5.000 | TIF6 |
| 17 | −180.814 | 63.456 | |
| 18 | 1.00E+18 | 63.352 | |
| 19 | 100.919 | 15.000 | B270 |
| 20 | 63.714 | 5.000 | |
| 21 | 66.713 | 24.000 | CAF2 |
| 22 | −409.888 | 9.360 | |
| 23 | 519.646 | 5.000 | B270 |
| 24 | 78.014 | 5.000 | |
| 25 | 70.529 | 20.000 | CAF2 |
| 26 | 541.462 | 18.850 | |
| 27 | −1245.897 | 7.000 | SF4 |
| 28 | 685.560 | 7.000 | KZFS1 |
| 29 | 462.177 | 7.000 | TIF6 |
| 30 | −791.080 | 1.000 | |
| 31 | 103.663 | 20.000 | CAF2 |
| 32 | −106.701 | 5.000 | |
| 33 | −76.509 | 5.000 | B270 |
| 34 | 157.872 | 13.523 | |
| 35 | −179.005 | 20.000 | FPL51 |
| 36 | −343.556 | 14.000 | |
| 37 | −74.369 | 24.882 | B270 |
| 38 | −105.000 | 5.000 | |
| 39 | 205.810 | 12.000 | B270 |
| 40 | 194.698 | 10.000 | |
| 41 | 266.013 | 24.000 | FPL51 |
| 42 | −408.413 | 1.000 | |
| 43 | 315.927 | 12.000 | B270 |
| 44 | 229.836 | 14.000 | |
| 45 | 793.737 | 30.000 | FPL51 |
| 46 | −195.443 | 93.007 | |
| 47 | 1.00E+18 | 557.973 | |
| IM | 1.00E+18 | 0.000 | |

| Surface | k | A | B | C | D | E | F | G |
|---|---|---|---|---|---|---|---|---|
| 3, 5 | 4.94E+01 | −3.86E−08 | −1.50E−12 | −2.04E−17 | −3.30E−20 | 7.99E−24 | −1.22E−27 | 7.72E−32 |
| 4 | 2.63E−01 | 1.02E−09 | 9.66E−15 | 1.18E−18 | −8.83E−23 | 5.95E−27 | −1.87E−31 | 2.82E−36 |
| 7 | 0.00E+00 | −1.09E−07 | −6.73E−12 | 1.09E−15 | −2.97E−18 | 2.27E−21 | −8.07E−25 | 8.54E−29 |
| 13 | 0.00E+00 | 2.61E−07 | 1.41E−11 | 0.00E+00 | 0.00E+00 | 0.00E+00 | 0.00E+00 | 0.00E+00 |
| 43 | −7.27E+00 | 0.00E+00 | 0.00E+00 | 0.00E+00 | 0.00E+00 | 0.00E+00 | 0.00E+00 | 0.00E+00 |
| 46 | −1.37E+00 | 0.00E+00 | 0.00E+00 | 0.00E+00 | 0.00E+00 | 0.00E+00 | 0.00E+00 | 0.00E+00 |

APPENDIX II

| Surface | Radius | Thickness | Material |
|---|---|---|---|
| 1 | 1.00E+18 | 149.500 | LAFN28 |
| 2 | −197.988 | −140.000 | MIRROR |
| 3 | −634.249 | 140.000 | MIRROR |
| 4 | 141.141 | 33.910 | |
| 5 | 235.473 | 16.154 | LAFN28 |
| 6 | 614.181 | 16.154 | |
| 7 | −84.114 | 16.154 | LAFN28 |
| 8 | −106.214 | 16.154 | |
| 9 | 113.162 | 21.538 | LAFN28 |
| 10 | −160.282 | 95.862 | |
| 11 | 159.085 | −103.368 | MIRROR |
| 12 | 1.00E+18 | 103.368 | |
| 13 | 1.00E+18 | −95.862 | |

APPENDIX II-continued

| Surface | Radius | Thickness | Material |
|---|---|---|---|
| 14 | 1.00E+18 | 95.862 | |
| 15 | 1.00E+18 | −103.368 | |
| 16 | 237.689 | 103.368 | MIRROR |
| 17 | 159.085 | 0.000 | |
| 18 | 1.00E+18 | 9.000 | |
| 19 | −11308.870 | 16.154 | N-LAK33A |
| 20 | 4298.391 | 5.385 | |
| 21 | 3535.574 | 16.154 | SF4 |
| 22 | 3687.039 | 28.644 | |
| 23 | 1.00E+18 | 91.493 | |
| 24 | 1.00E+18 | 5.385 | LAFN28 |
| 25 | 1.00E+18 | 275.333 | |
| 26 | 1.00E+18 | 380.000 | |
| 27 | −83.357 | 16.154 | N-LAK33A |
| 28 | −211.442 | 10.769 | |
| 29 | 263.250 | 26.923 | LAFN28 |
| 30 | 199.615 | 27.000 | |
| IM | 1.00E+18 | 0.000 | |

| Surface | k | A | B | C | D | E | F | G |
|---|---|---|---|---|---|---|---|---|
| 2 | 2.80E−01 | 4.40E−10 | 3.36E−14 | −4.01E−19 | −6.43E−24 | 3.15E−27 | −1.35E−31 | 2.42E−36 |
| 3 | 5.54E+01 | −4.87E−08 | −1.10E−12 | 1.35E−16 | −1.18E−19 | 2.68E−23 | −3.39E−27 | 1.77E−31 |
| 4 | 0.00E+00 | −1.25E−07 | 4.27E−11 | 3.72E−15 | −7.24E−19 | 0.00E+00 | 0.00E+00 | 0.00E+00 |
| 5 | −8.91E+00 | 0.00E+00 | 0.00E+00 | 0.00E+00 | 0.00E+00 | 0.00E+00 | 0.00E+00 | 0.00E+00 |
| 7 | −1.86E+00 | 0.00E+00 | 0.00E+00 | 0.00E+00 | 0.00E+00 | 0.00E+00 | 0.00E+00 | 0.00E+00 |
| 9 | 4.90E−01 | −1.43E−07 | −1.71E−11 | −4.56E−15 | 5.37E−18 | 0.00E+00 | 0.00E+00 | 0.00E+00 |
| 10 | −2.43E+01 | 4.10E−07 | −1.08E−10 | 3.69E−14 | −3.48E−18 | 0.00E+00 | 0.00E+00 | 0.00E+00 |
| 11 | −6.51E−01 | 8.29E−07 | −2.90E−10 | 1.51E−13 | −4.75E−17 | −3.90E−22 | 8.09E−24 | −2.36E−27 |
| 16 | −2.43E+01 | 4.44E−09 | 1.85E−13 | −1.16E−17 | 1.39E−21 | −8.94E−26 | 3.14E−30 | −4.76E−35 |
| 17 | −2.43E+01 | 0.00E+00 | 0.00E+00 | 0.00E+00 | 0.00E+00 | 0.00E+00 | 0.00E+00 | 0.00E+00 |
| 19 | 0.00E+00 | 6.26E−09 | 1.75E−14 | −6.21E−17 | 4.14E−21 | 0.00E+00 | 0.00E+00 | 0.00E+00 |
| 20 | 0.00E+00 | −1.47E−08 | 6.29E−13 | −8.19E−17 | 4.89E−21 | 0.00E+00 | 0.00E+00 | 0.00E+00 |
| 21 | 0.00E+00 | −6.36E−09 | 7.23E−14 | 0.00E+00 | 0.00E+00 | 0.00E+00 | 0.00E+00 | 0.00E+00 |
| 22 | 0.00E+00 | −8.18E−09 | 6.58E−14 | 0.00E+00 | 0.00E+00 | 0.00E+00 | 0.00E+00 | 0.00E+00 |
| 24 | 0.00E+00 | −5.43E−08 | −1.12E−12 | −4.24E−16 | 1.10E−19 | −1.96E−23 | 1.67E−27 | −5.98E−32 |
| 27 | 0.00E+00 | 2.92E−07 | 1.39E−11 | 2.52E−15 | −2.10E−19 | 6.81E−23 | 0.00E+00 | 0.00E+00 |
| 29 | 0.00E+00 | 8.27E−09 | −2.15E−12 | 0.00E+00 | 0.00E+00 | 0.00E+00 | 0.00E+00 | 0.00E+00 |

APPENDIX III

System/Prescription Data

| Surface | Radius | Thickness | Material |
|---|---|---|---|
| 1 | 1.00E+18 | 149.500 | LAFN28 |
| 2 | −197.988 | −140.000 | MIRROR |
| 3 | −634.249 | 140.000 | MIRROR |
| 4 | 141.141 | 96.051 | |
| 5 | 73.101 | 22.000 | LAFN28 |
| 6 | −1673.729 | 110.215 | |
| 7 | 168.557 | −121.515 | MIRROR |
| 8 | 1.00E+18 | 121.515 | |
| 9 | 1.00E+18 | −110.215 | |
| 10 | 1.00E+18 | 110.215 | |
| 11 | 1.00E+18 | −121.515 | |
| 12 | 285.373 | 121.515 | MIRROR |
| 13 | 168.557 | 0.000 | |
| 14 | 1.00E+18 | 30.000 | |
| 15 | 1.00E+18 | 91.493 | |
| 16 | 189.380 | 14.036 | LAFN28 |
| 17 | 173.176 | 957.987 | |
| 18 | −116.038 | 12.581 | LAFN28 |
| 19 | −106.989 | 15.000 | |
| 20 | 339.205 | 30.000 | LAFN28 |
| 21 | 537.060 | 22.000 | |
| 22 | −97.479 | 26.923 | LAFN28 |
| 23 | 1.00E+18 | 20.000 | |
| IM | 1.00E+18 | 0.000 | |

| Surface | k | A | B | C | D | E | F | G |
|---|---|---|---|---|---|---|---|---|
| 2.00E+00 | 2.80E−01 | 8.59E−10 | 1.80E−14 | 8.04E−20 | −2.14E−23 | 3.61E−27 | −1.51E−31 | 2.72E−36 |
| 3.00E+00 | 5.57E+01 | −4.16E−08 | −9.46E−13 | −1.41E−16 | −6.63E−20 | 2.43E−23 | −3.99E−27 | 2.47E−31 |
| 4.00E+00 | 0.00E+00 | 7.60E−09 | −3.01E−11 | 4.74E−15 | −7.14E−19 | 0.00E+00 | 0.00E+00 | 0.00E+00 |
| 5.00E+00 | 1.06E+00 | 3.14E−07 | 5.86E−11 | −5.27E−14 | 3.11E−17 | 0.00E+00 | 0.00E+00 | 0.00E+00 |
| 6.00E+00 | 0.00E+00 | 1.80E−06 | −3.15E−10 | 1.89E−14 | 5.10E−17 | 0.00E+00 | 0.00E+00 | 0.00E+00 |

APPENDIX III-continued

System/Prescription Data

| | | | | | | | | |
|---|---|---|---|---|---|---|---|---|
| 7.00E+00 | −3.65E+01 | 6.76E−07 | −5.34E−10 | 3.59E−13 | −1.98E−16 | 7.75E−20 | −1.81E−23 | 1.83E−27 |
| 1.20E+01 | −7.62E−01 | 1.25E−09 | 2.82E−14 | −6.26E−18 | 5.69E−22 | −3.08E−26 | 8.49E−31 | −9.28E−36 |
| 1.30E+01 | −3.65E+01 | 0.00E+00 | 0.00E+00 | 0.00E+00 | 0.00E+00 | 0.00E+00 | 0.00E+00 | 0.00E+00 |
| 1.60E+01 | 0.00E+00 | 4.82E−10 | −6.59E−13 | 1.41E−16 | −1.83E−20 | 1.61E−24 | −7.99E−29 | 1.67E−33 |
| 1.80E+01 | 0.00E+00 | −4.42E−07 | 7.13E−11 | −1.27E−14 | 1.05E−18 | −4.30E−23 | 0.00E+00 | 0.00E+00 |
| 2.00E+01 | 0.00E+00 | 3.92E−07 | −7.70E−11 | 1.18E−14 | −1.17E−18 | 6.50E−23 | 0.00E+00 | 0.00E+00 |
| 2.20E+01 | 0.00E+00 | 5.46E−07 | −1.29E−11 | 0.00E+00 | 0.00E+00 | 0.00E+00 | 0.00E+00 | 0.00E+00 |

APPENDIX IV

| Surface | Radius | Thickness | Material |
|---|---|---|---|
| 1 | 1.00E+18 | 1.000 | LAFN28 |
| 2 | 1.00E+18 | 1.830 | LAFN28 |
| 3 | −608.541 | 9.769 | LAFN28 |
| 4 | −328.156 | 140.000 | LAFN28 |
| 5 | −197.988 | −141.350 | MIRROR |
| 6 | −328.156 | 140.000 | MIRROR |
| 7 | 1.00E+18 | 0.000 | LAFN28 |
| 8 | 2487.658 | 36.000 | |
| 9 | −92.956 | 16.154 | LAFN28 |
| 10 | −121.673 | 16.154 | |
| 11 | −1585.521 | 28.000 | LAFN28 |
| 12 | −693.489 | 16.154 | |
| 13 | −1071.102 | 25.000 | LAFN28 |
| 14 | 575.050 | 35.000 | |
| 15 | −519.052 | 25.000 | LAFN28 |
| 16 | −237.364 | 25.000 | |
| 17 | 789.585 | 20.000 | LAFN28 |
| 18 | 569.541 | 15.000 | |
| 19 | 441.160 | 18.000 | B270 |
| 20 | 393.980 | 12.000 | |
| 21 | 259.100 | 18.000 | FPL51 |
| 22 | 399.161 | 12.000 | |
| 23 | 1.00E+18 | 732.693 | |
| 24 | −230.411 | 35.000 | SF6 |
| 25 | −295.645 | 18.000 | |
| 26 | 2437.154 | 35.000 | SF6 |
| 27 | −6965.915 | 18.000 | |
| 28 | 546.308 | 45.000 | LAFN28 |
| 29 | −1171.558 | 18.000 | |
| 30 | 199.299 | 45.000 | LAFN28 |
| 31 | 1.00E+18 | 15.000 | |
| IM | 1.00E+18 | 0.000 | |

| Surface | k | A | B | C | D | E | F | G |
|---|---|---|---|---|---|---|---|---|
| 4, 6 | 1.53E+01 | −1.54E−08 | 4.55E−14 | −4.07E−17 | 5.30E−20 | −7.40E−24 | 2.20E−28 | 1.33E−31 |
| 5 | 2.49E−01 | 6.12E−10 | 1.18E−14 | 3.07E−19 | 6.62E−24 | −4.67E−29 | −2.93E−34 | 3.56E−37 |
| 8 | 0.00E+00 | 8.92E−10 | 1.04E−12 | 1.38E−15 | −5.07E−19 | 1.23E−22 | −1.07E−26 | 8.32E−32 |
| 9 | 0.00E+00 | 3.67E−08 | 5.15E−12 | 4.42E−16 | 4.95E−20 | 1.58E−23 | 0.00E+00 | 0.00E+00 |
| 18 | 0.00E+00 | 3.92E−09 | −1.10E−14 | 4.21E−18 | −7.30E−22 | 2.01E−26 | 0.00E+00 | 0.00E+00 |
| 30 | 0.00E+00 | 1.42E−09 | −5.48E−13 | 8.88E−18 | −3.89E−21 | 7.62E−26 | 0.00E+00 | 0.00E+00 |

APPENDIX V

| Surface | Radius | Thickness | Material |
|---|---|---|---|
| 1 | 1.00E+18 | 1.000 | LAFN28 |
| 2 | 1.00E+18 | 8.485 | LAFN28 |
| 3 | −146.1654 | 150.000 | LAFN28 |
| 4 | −182.560 | −150.000 | MIRROR |
| 5 | −146.165 | 150.000 | MIRROR |
| 6 | −182.560 | 0.000 | LAFN28 |
| 7 | 208.171 | 5.000 | |
| 8 | 177.944 | 18.000 | BK7 |
| 9 | −235.373 | 13.000 | |
| 10 | −63.454 | 15.000 | LAFN28 |
| 11 | −69.129 | 5.000 | |
| 12 | 1654.824 | 18.000 | LAFN28 |
| 13 | 197.027 | 16.000 | |
| 14 | −95.804 | 20.000 | LAFN28 |
| 15 | −429.180 | 10.000 | |

APPENDIX V-continued

| | | | |
|---|---|---|---|
| 16 | −906.927 | 20.000 | LAFN28 |
| 17 | −113.307 | 10.000 | |
| 18 | 169.112 | 20.000 | LAFN28 |
| 19 | −377.815 | 10.000 | |
| 20 | −114.703 | 20.000 | LAFN28 |
| 21 | −387.546 | 14.000 | |
| 22 | −182.384 | 20.000 | LAFN28 |
| 23 | −4827.134 | 10.000 | |
| 24 | −291.035 | 20.000 | LAFN28 |
| 25 | 525.317 | 12.000 | |
| 26 | −1989.556 | 25.000 | LAFN28 |
| 27 | 286.288 | 15.000 | |
| 28 | 1641.395 | 20.000 | LAFN28 |
| 29 | −255.152 | 10.000 | |
| 30 | −541.392 | 20.000 | LAFN28 |
| 31 | −1243.401 | 36.551 | |
| 32 | 263.838 | 20.000 | LAFN28 |
| 33 | 21019.480 | 6.000 | |
| 34 | 700.000 | 25.000 | LAFN28 |
| 35 | −385.153 | 10.000 | |
| 36 | 999.506 | 30.000 | SF66 |
| 37 | 1.00E+18 | 10.000 | |
| IM | 1.00E+18 | 0.000 | |

| Surface | k | A | B | C | D | E | F | G |
|---|---|---|---|---|---|---|---|---|
| 3, 5 | 5.961802 | 4.16E−08 | 2.92E−11 | −1.57E−14 | 2.02E−17 | −1.05E−20 | 3.10E−24 | −3.14E−28 |
| 4, 6 | 0.112008 | 6.61E−10 | −2.06E−15 | 2.95E−18 | −2.59E−22 | 1.50E−26 | −4.48E−31 | 5.94E−36 |
| 7 | 0.00E+00 | −3.61E−07 | 6.01E−10 | 2.77E−14 | −3.92E−17 | 3.43E−20 | −1.83E−23 | −4.47E−28 |
| 8 | 0.00E+00 | −8.23E−07 | 8.24E−10 | −3.70E−14 | 4.77E−17 | −4.48E−20 | 1.21E−24 | 5.80E−28 |
| 20 | 0.00E+00 | 3.10E−07 | −2.83E−11 | 8.91E−15 | −4.17E−18 | 1.51E−21 | −3.01E−25 | 2.83E−29 |
| 32 | 0.00E+00 | −5.27E−08 | 1.90E−13 | 7.79E−16 | −9.71E−20 | 6.34E−24 | 2.67E−30 | −2.18E−32 |
| 36 | 0.00E+00 | 6.88E−08 | −1.01E−11 | 6.04E−15 | −2.34E−18 | 4.61E−22 | −4.85E−26 | 2.13E−30 |

While the embodiments according to the present invention have been described with reference to exemplary embodiments, it is to be understood that the present invention is not limited to the above described embodiments. The scope of the following claims is to be accorded the broadest interpretation so as to encompass all such modifications and equivalent structures and functions.

What is claimed is:

1. An optical system comprising:
a catadioptric subsystem configured to collect light from an object;
a refractive subsystem configured to form an image of the object through the catadioptric subsystem; and
a baffle arranged along an optical axis of the optical system and configured to block light, which travels toward the refractive subsystem without being reflected by the catadioptric subsystem, to form a shielded portion in a center of an exit pupil plane of the optical system,
wherein the catadioptric subsystem includes a partially transparent surface around the optical axis so that transmissivity of a region, other than the shielded portion, in the exit pupil plane varies in a radial direction of the exit pupil plane.

2. The optical system according to claim 1,
wherein the catadioptric subsystem is configured to form a first intermediate image of the object, and
wherein the refractive subsystem is configured to form the image of the object based on the first intermediate image.

3. The optical system according to claim 1, wherein the catadioptric subsystem is formed of a solid optical element including an object-side surface and an image-side surface opposite to each other.

4. The optical system according to claim 3, wherein the solid optical element collects light in a manner such that the light from the object is reflected by the object-side surface and the image-side surface for a plurality of times.

5. The optical system according to claim 1, wherein the catadioptric subsystem includes a first catadioptric component and a second catadioptric component at a distance from each other.

6. The optical system according to claim 5, wherein the first catadioptric component includes an object-side surface and an image-side surface having a flat region thereof, and the second catadioptric component includes an image-side surface and an object-side surface having a flat portion thereof configured to face the flat region of the first catadioptric component.

7. The optical system according to claim 6, wherein the object-side surface of the first catadioptric component is convex towards an object plane, and the image-side surface of the second catadioptric component is convex towards an image side.

8. The optical system according to claim 1, wherein the region other than the shielded portion includes, in order from a side of the optical axis to an outer side, a first portion having a first transmissivity and a second portion having a second transmissivity higher than the first transmissivity.

9. The optical system according to claim 8, wherein the region other than the shielded portion includes, in an outer side further than the second portion, a third portion having a transmissivity lower than the second transmissivity.

10. The optical system according to claim 9,
wherein the partially transparent surface includes, in order from the side of the optical axis to the outer side, a first area having a first reflectivity, a second area having a second reflectivity higher than the first reflectivity, and a third area having a reflectivity higher than the second reflectivity, and
wherein light having passed through the second area reaches the third portion.

11. The optical system according to claim 10, wherein light, among the light from the object, not entering the baffle after passing through the first area reaches the first portion and the second portion.

12. The optical system according to claim 10, wherein the partially transparent surface is arranged on an object-side surface of the catadioptric subsystem and an image-side surface of the catadioptric subsystem includes a total reflection region.

13. The optical system according to claim 10, wherein light, among the light from the object, being reflected at the total reflection region after passing through the first area includes a first light which reaches the first portion by being reflected by the second area and a second light which reaches the second portion by being reflected by the third area.

14. The optical system according to claim 10, wherein light, among the light from the object, being reflected at the total reflection region after passing through the second area reaches the third portion by being reflected by the third area.

15. The optical system according to claim 8, wherein the partially transparent surface includes, in order from the side of the optical axis to the outer side, a first area having a first reflectivity, a second area having a second reflectivity higher than the first reflectivity, and a third area having a reflectivity higher than the second reflectivity.

16. The optical system according to claim 15, wherein light, among the light from the object, not entering the baffle after passing through the first area reaches the first portion and the second portion.

17. The optical system according to claim 15, wherein the first reflectivity is 0%.

18. The optical system according to claim 15, wherein the partially transparent surface is arranged on an object-side surface of the catadioptric subsystem and an image-side surface of the catadioptric subsystem includes a total reflection region.

19. The optical system according to claim 18, wherein light, among the light from the object, being reflected at the total reflection region after passing through the first area includes a first light which reaches the first portion by being reflected by the second area and a second light which reaches the second portion by being reflected by the third area.

* * * * *